US012701737B2

(12) United States Patent
Choi et al.

(10) Patent No.: US 12,701,737 B2
(45) Date of Patent: Aug. 4, 2026

(54) SEMICONDUCTOR DEVICE

(71) Applicant: SAMSUNG ELECTRONICS CO., LTD., Suwon-si (KR)

(72) Inventors: Jin Young Choi, Suwon-si (KR); Woo Sung Park, Suwon-si (KR); Min Seok Jo, Suwon-si (KR); Ji Won Park, Suwon-si (KR); Han Young Song, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 401 days.

(21) Appl. No.: 18/478,215

(22) Filed: Sep. 29, 2023

(65) Prior Publication Data

US 2024/0339536 A1 Oct. 10, 2024

(30) Foreign Application Priority Data

Apr. 4, 2023 (KR) ........................ 10-2023-0043980

(51) Int. Cl.
*H01L 29/78* (2006.01)
*H01L 21/8234* (2006.01)
(Continued)

(52) U.S. Cl.
CPC ........... *H10D 30/62* (2025.01); *H10D 30/014* (2025.01); *H10D 30/024* (2025.01); *H10D 30/43* (2025.01); *H10D 30/6735* (2025.01); *H10D 30/6757* (2025.01); *H10D 62/121* (2025.01); *H10D 62/151* (2025.01); *H10D 64/017* (2025.01);
(Continued)

(58) Field of Classification Search
CPC ........... H10W 20/023; H10W 20/0698; H10W 20/2134; H10D 30/024; H10D 30/62; H10D 62/121; H10D 84/0158; H10D 84/0193; H10D 84/853
See application file for complete search history.

(56) References Cited

U.S. PATENT DOCUMENTS 10,985,057 B2 4/2021 Jourdain et al.
11,133,254 B2 9/2021 Lai et al.
(Continued)

OTHER PUBLICATIONS

Office Action dated Jun. 9, 2026 issued in the corresponding Korean Patent Application No. 10-2023-0043980.

*Primary Examiner* — John A Bodnar
(74) *Attorney, Agent, or Firm* — MORGAN, LEWIS & BOCKIUS LLP

(57) ABSTRACT

A semiconductor device includes a back interlayer insulating film, a back wiring line in the back interlayer insulating film, a fin-shaped pattern on a first surface of the back wiring line, a field insulating film disposed on the fin-shaped pattern, a source/drain pattern on the fin-shaped pattern, a source/drain contact disposed on the source/drain pattern and connected to the source/drain pattern and a contact connecting via connecting the back wiring line and the source/drain contact, and is in contact with the back wiring line. The contact connecting via includes a first surface connected to the source/drain contact, and a second surface contacted to the back wiring line. A height from a second surface of the back wiring line to an upper surface of the field insulating film is smaller than a height from the second surface of the back wiring line to the first surface of the contact connecting via.

20 Claims, 31 Drawing Sheets

(51) Int. Cl.

| | |
|---|---|
| *H01L 23/48* | (2006.01) |
| *H01L 23/528* | (2006.01) |
| *H01L 27/088* | (2006.01) |
| *H01L 29/06* | (2006.01) |
| *H01L 29/08* | (2006.01) |
| *H01L 29/423* | (2006.01) |
| *H01L 29/66* | (2006.01) |
| *H01L 29/775* | (2006.01) |
| *H01L 29/786* | (2006.01) |
| *H10D 30/01* | (2025.01) |
| *H10D 30/43* | (2025.01) |
| *H10D 30/62* | (2025.01) |
| *H10D 30/67* | (2025.01) |
| *H10D 62/10* | (2025.01) |
| *H10D 62/13* | (2025.01) |
| *H10D 64/01* | (2025.01) |
| *H10D 84/01* | (2025.01) |
| *H10D 84/03* | (2025.01) |
| *H10D 84/83* | (2025.01) |
| *H10W 20/20* | (2026.01) |
| *H10W 20/43* | (2026.01) |

(52) U.S. Cl.
CPC ....... *H10D 84/013* (2025.01); *H10D 84/0149* (2025.01); *H10D 84/0151* (2025.01); *H10D 84/0158* (2025.01); *H10D 84/038* (2025.01); *H10D 84/83* (2025.01); *H10W 20/20* (2026.01); *H10W 20/43* (2026.01)

(56) References Cited

U.S. PATENT DOCUMENTS

| | | | | |
|---|---|---|---|---|
| 2021/0242203 | A1 | 8/2021 | Ding et al. | |
| 2021/0375722 | A1 | 12/2021 | Kim et al. | |
| 2021/0407999 | A1* | 12/2021 | Huang | ................... H10D 30/43 |
| 2022/0037236 | A1 | 2/2022 | Seo et al. | |
| 2022/0130761 | A1 | 4/2022 | Kim et al. | |
| 2022/0139900 | A1 | 5/2022 | Oh et al. | |
| 2022/0230947 | A1 | 7/2022 | Park et al. | |
| 2022/0301878 | A1 | 9/2022 | Xie et al. | |
| 2024/0178101 | A1* | 5/2024 | Chu | ................... H10D 30/6729 |

* cited by examiner

INT_GS1

245
220
230 GS2
240
156
255
250
230
220 INT_GS2
NS2

SEMICONDUCTOR DEVICE

CROSS-REFERENCE TO RELATED APPLICATION

This U.S. patent application claims priority under 35 U.S.C. 119 to Korean Patent Application No. 10-2023-0043980 filed on Apr. 4, 2023 in the Korean Intellectual Property Office, the disclosure of which is incorporated by reference in its entirety herein.

1. TECHNICAL FIELD

The present disclosure relates to a semiconductor device.

2. DISCUSSION OF RELATED ART

A semiconductor device is an electronic component that relies on the electronic properties of a semiconductor material for its function. Semiconductor devices may be manufactured as single discrete devices and as integrated circuit (IC) chips that include several electric components. A transistor is a semiconductor device used to amplify or switch electrical signals and is one of the basis building blocks of modern electronics. A typical transistor has a single gate.

A transistor including two gates (e.g., a multi gate transistor) may be used for increasing density of the semiconductor device. The multi gate transistor may include a multi-channel active pattern (or a silicon body) having a fin or nanowire shape formed on a substrate and a gate formed on a surface of the multi-channel active pattern.

Since such a multi gate transistor utilizes a three-dimensional channel, scaling may be easily performed. Further, even if a gate length of the multi gate transistor is not increased, the current control capability may be increased. Moreover, a short channel effect (SCE) in which potential of a channel region is influenced by a drain voltage may be effectively suppressed when using a multi gate transistor.

However, as a pitch size of the semiconductor device becomes smaller, it may be difficult to reduce the capacitance between contacts in the semiconductor device and ensure electrical stability when a multi gate transistor is used.

SUMMARY

Aspects of the present disclosure provide a semiconductor device with increased performance and reliability.

According to an aspect of the present disclosure, there is provided a semiconductor device including a back interlayer insulating film, a back wiring line, a fin-shaped pattern, a field insulating film, a source/drain pattern, a source/drain contact, and a contact connecting via. The back wiring line is disposed in the back interlayer insulating film and includes a first surface and a second surface that opposes the first surface in a first direction. The fin-shaped pattern is disposed on the first surface of the back wiring line and extends in a second direction. The field insulating film is disposed on a side wall of the fin-shaped pattern. The source/drain pattern is disposed on the fin-shaped pattern. The source/drain contact is disposed on the source/drain pattern and is connected to the source/drain pattern. The contact connecting via connects the back wiring line and the source/drain contact, and is in contact with the back wiring line. The contact connecting via includes a first surface connected to the source/drain contact, and a second surface connected to the back wiring line. A height from the second surface of the back wiring line to an upper surface of the field insulating film is smaller than a height from the second surface of the back wiring line to the first surface of the contact connecting via.

According to an aspect of the present disclosure, there is provided a semiconductor device including a back interlayer insulating film, a back wiring line, a first element isolation structure, a second element isolation structure, a fin-shaped pattern, a gate electrode, a source/drain pattern, a source/drain contact, a contact connecting via, and a front wiring line. The back wiring line is disposed inside the back interlayer insulating film, includes a first surface and a second surface that opposes the first surface in a first direction. The first element isolation structure is disposed on the back wiring line and extends in a second direction. The second element isolation structure is disposed on the back wiring line, extends in the second direction, and is spaced apart from the first element isolation structure in a third direction. The fin-shaped pattern is disposed on the back wiring line and extends in the third direction. The gate electrode is disposed on the fin-shaped pattern and extends in the second direction. The source/drain pattern is disposed on the fin-shaped pattern and connected to the fin-shaped pattern. The source/drain contact is disposed on the source/drain pattern and is connected to the source/drain pattern. The contact connecting via is disposed between the first element isolation structure and the second element isolation structure, and is in contact with the back wiring line. A width of the contact connecting via increases as it goes away from the back wiring line. The front wiring line is disposed on the first element isolation structure and the second element isolation structure, extends in the third direction, and connects the source/drain contact and the contact connecting via.

According to an aspect of the present disclosure, there is provided a semiconductor device including a fin-shaped pattern, a sheet pattern, a gate electrode, a source/drain pattern, a source/drain contact, an insertion insulating film, a back wiring line, and a contact connecting via. The fin-shaped pattern extends in a first direction, and includes a first surface and a second surface that opposes the first surface in a second direction. The sheet pattern is disposed on the first surface of the fin-shaped pattern, and is spaced apart from the fin-shaped pattern in the second direction. The gate electrode is disposed on the first surface of the fin-shaped pattern, extends in a third direction, and surrounds the sheet pattern. The source/drain pattern is disposed on the first surface of the fin-shaped pattern, and is in contact with the sheet pattern. The source/drain contact is disposed on the source/drain pattern and is connected to the source/drain pattern. The insertion insulating film is disposed on the second surface of the fin-shaped pattern, and is in contact with the second surface of the fin-shaped pattern. The back wiring line is disposed on the second surface of the fin-shaped pattern, extends in the first direction, and includes a first surface and a second surface that opposes the first surface in the second direction. The contact connecting via connects the back wiring line and the source/drain contact, and is in contact with the back wiring line. The contact connecting via includes a first surface connected to the source/drain contact, and a second surface contacted to the back wiring line. A height from the second surface of the back wiring line to the first surface of the fin-shaped pattern is smaller than a height from the second surface of the back wiring line to the first surface of the contact connecting via.

BRIEF DESCRIPTION OF DRAWINGS

The above and other aspects and features of the present disclosure will become more apparent by describing in detail illustrative embodiments thereof with reference to the attached drawings, in which:

FIGS. 2 to 7 are cross-sectional views taken along A-A, B-B, C-C, D-D, E-E and F-F of FIG. 1.

Figure 18:
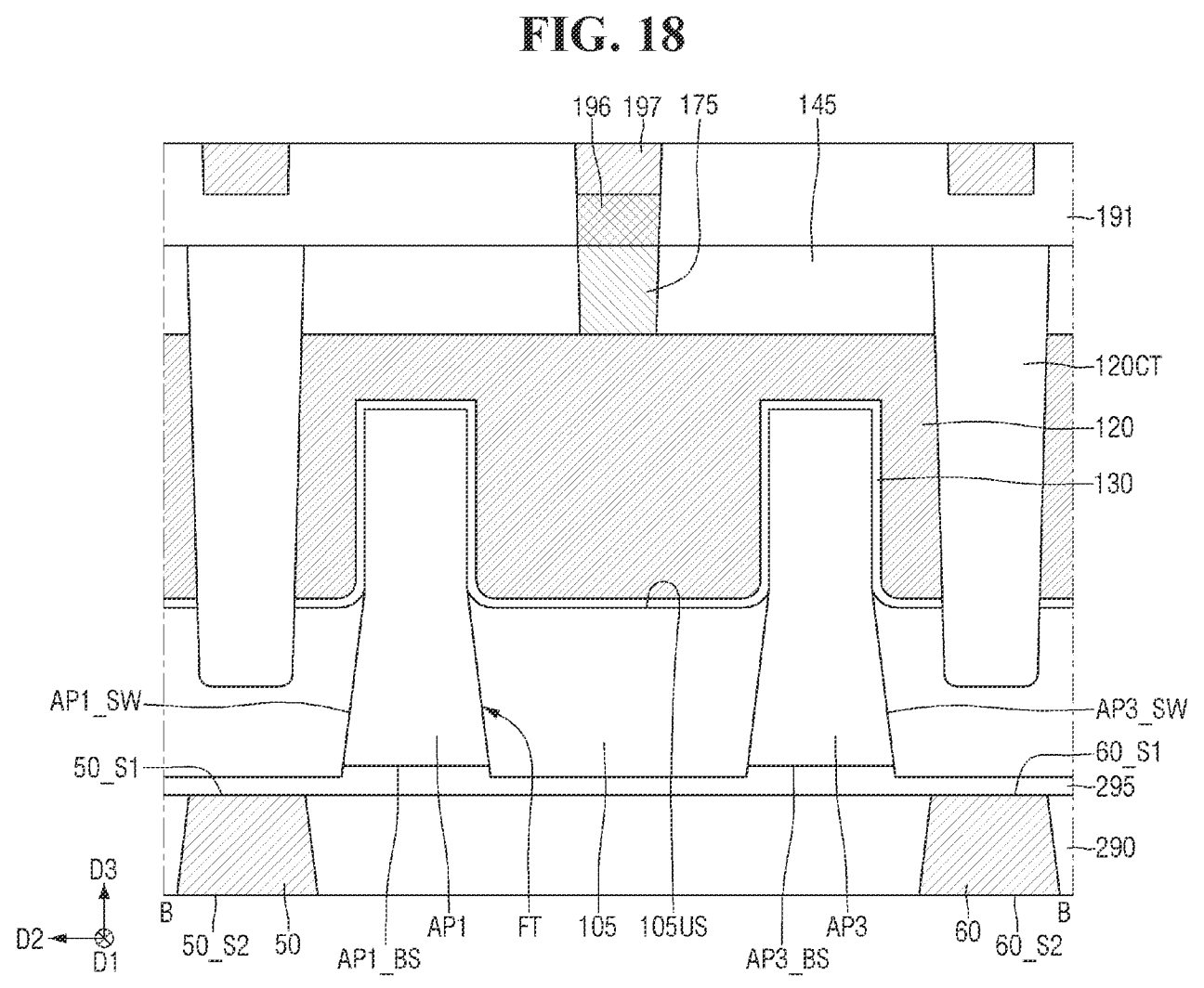

FIGS. 16 to 18 are diagrams for explaining a semiconductor device according to some embodiments.

FIGS. 20 and 21 are cross-sectional views taken along lines A-A and C-C of FIG. 19.

FIGS. 24 to 31 are intermediate step diagrams for describing a method of manufacturing a semiconductor device according to an embodiment.

DETAILED DESCRIPTION OF THE EMBODIMENTS

Although terms such as first and second are used to describe various elements or components in the present specification, these elements or components are not limited by these terms. These terms are only used to distinguish a single element or component from other elements or components. Therefore, a first element or component referred to below may be a second element or component within the technical idea of the present disclosure.

Although drawings relating to semiconductor devices according to some embodiments show a fin-type transistor (FinFET) including a channel region having a fin-type pattern shape, a transistor including nanowire or nanosheet, and a MBCFET™ (Multi-Bridge Channel Field Effect Transistor), the embodiments are not limited thereto.

The semiconductor device according to some embodiments may include a tunneling transistor (tunneling FET), a three-dimensional (3D) transistor or a vertical transistor (Vertical FET). The semiconductor device according to some embodiments may include a planar transistor. In addition, the technical idea of the present disclosure may be applied to a transistor based on two-dimensional material (2D material based FETs) and a heterostructure thereof. Further, the semiconductor device according to some embodiments may also include a bipolar junction transistor, a laterally diffused metal oxide semiconductor (LDMOS), or the like.

A semiconductor device according to an embodiments will be described with reference to FIGS. 1 to 7.

Figure 1:
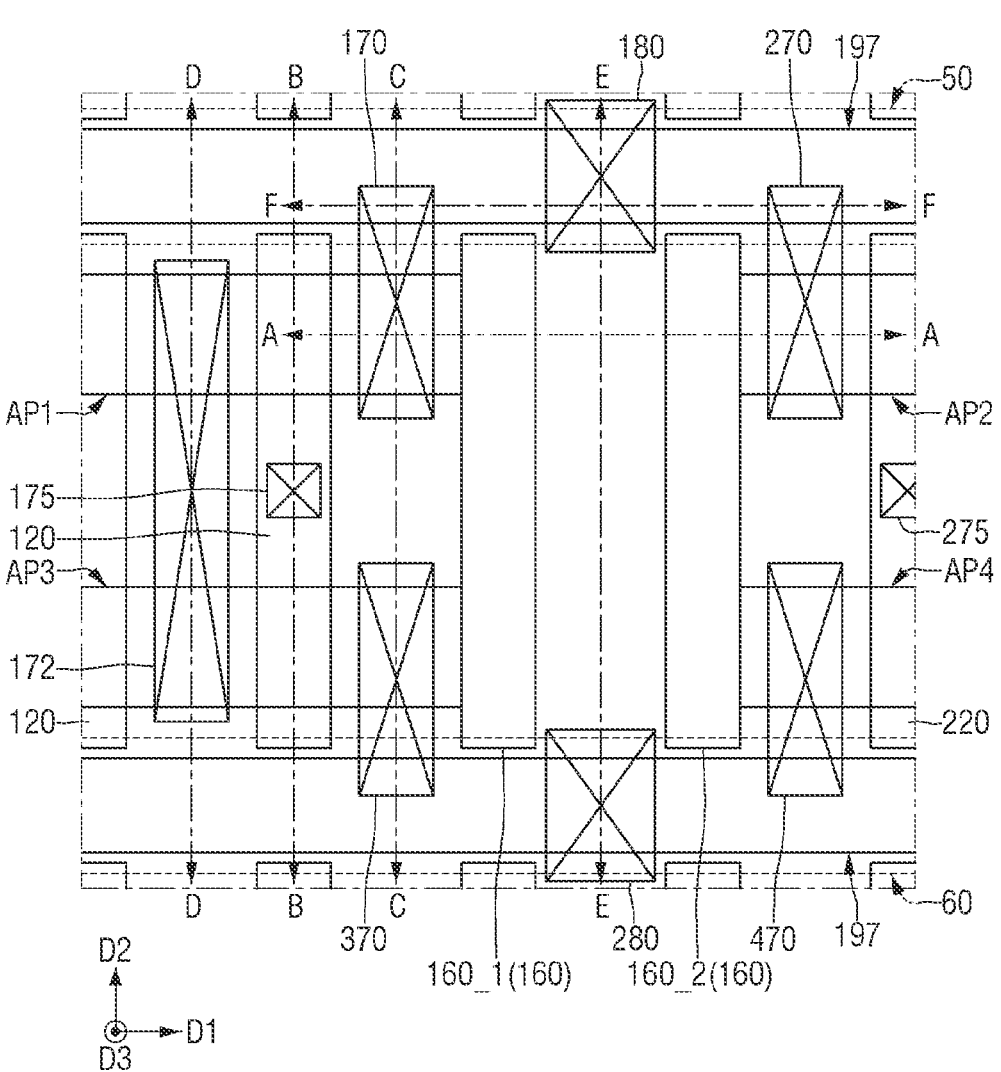
FIG. 1 is a layout diagram for explaining a semiconductor device according to an embodiment.

FIG. 1 is a layout diagram for explaining a semiconductor device according to an embodiment. FIGS. 2 to 7 are cross-sectional views taken along A-A, B-B, C-C, D-D, E-E and F-F of FIG. 1.

For convenience of explanation, a front wiring via 196, a front wiring line 197, and a wiring connecting via 198 are not shown in FIG. 1.

Referring to FIGS. 1 to 7, the semiconductor device according to an embodiment includes a first active pattern AP1, a second active pattern AP2, a third active pattern AP3, a fourth active pattern AP4, a first back wiring line 50, a second back wiring line 60, a first gate electrode 120, a second gate electrode 220, a first source/drain pattern 150, a second source/drain pattern 250, a third source/drain pattern 350, a first element isolation structure 160, a first source/drain contact 170, a second source/drain contact 270, a third source/drain contact 370, a fourth source/drain contact 470, a first contact connecting via 180, a second contact connecting via 280, and a front wiring structure 195.

Figure 3:
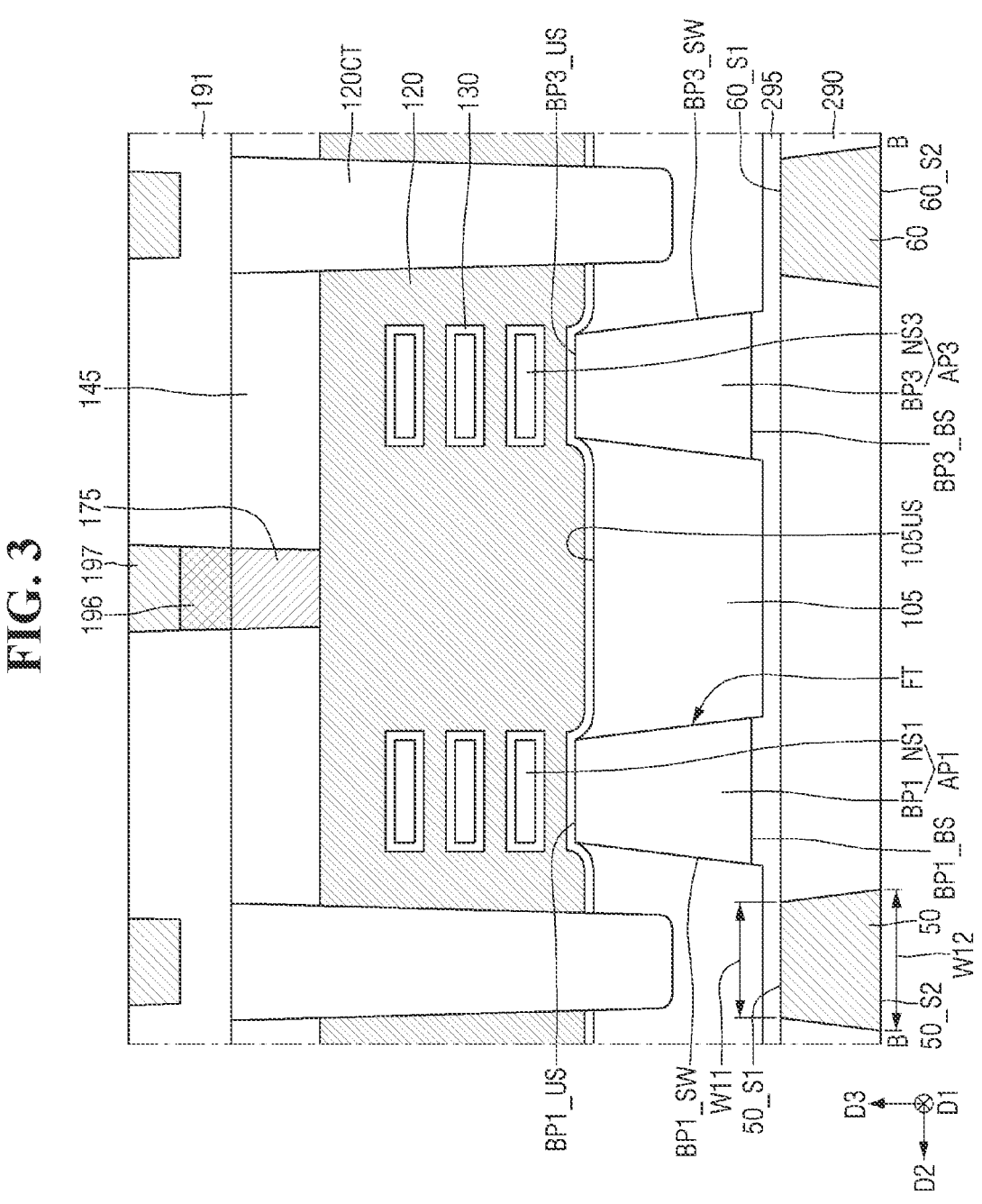

As shown in FIG. 3, the first back wiring line 50 and the second back wiring line 60 may be disposed inside the back interlayer insulating film 290. In an embodiment, the first back wiring line 50 and the second back wiring line 60 each have a line shape or a trapezoidal shape extending in a first direction D1. The first back wiring line 50 may be spaced apart from the second back wiring line 60 in a second direction D2.

As an example, the first back wiring line 50 and the second back wiring line 60 may be power lines that supply power to the semiconductor device. As another example, the first back wiring line 50 and the second back wiring line 60 may be signal lines that supply an operating signal of the semiconductor device. As still another example, one of the first back wiring line 50 and the second back wiring line 60 may be the power line, and the other thereof may be the signal line.

As shown in FIG. 3, the first back wiring line 50 includes a first surface 50_S1 and a second surface 50_S2 that are opposite to each other in a third direction D3. As further shown in FIG. 3, the second back wiring line 60 includes a first surface 60_S1 and a second surface 60_S2 that are opposite to each other in the third direction D3. Here, the first direction D1 may intersect the second direction D2 and the third direction D3. Also, the second direction D2 may intersect the third direction D3.

The first back wiring line 50 will be described as an example. The first back wiring line 50 may have a trapezoidal cross-section. In the semiconductor device according to an embodiment, a width W11 of the first surface 50_S1 of the first back wiring line 50 in the second direction D2 is smaller than a width W12 of the second surface 50_S2 of the first back wiring line 50 in the second direction D2.

For example, the first back wiring line 50 and the second back wiring line 60 may be formed, using a damascene process. After a trench extending in the first direction D1 is formed in the back interlayer insulating film 290, the first back wiring line 50 may be formed by filling the trench. For example, a portion of the back interlayer insulating film 290 may be removed to form the trench.

Although the first back wiring line 50 and the second back wiring line 60 are shown to have a single conductive film structure, embodiments of the disclosure are not limited thereto. Unlike the shown example, the first back wiring line 50 and the second back wiring line 60 may have multiple conductive film structures, like the first contact connecting via 180 and the second contact connecting via 280.

The first back wiring line 50 and the second back wiring line 60 may include, for example, at least one of a metal, conductive metal nitride, conductive metal carbide, conductive metal oxide, conductive metal carbonitride, and a two-dimensional material. The two-dimensional material (2D material) may include two-dimensional allotrope or a two-dimensional compound, and may include, but is not limited to, at least one of graphene, boron nitride (BN), molybdenum sulfide, molybdenum selenide, tungsten sulfide, tungsten selenide, and tantalum sulfide. That is, since the two-dimensional materials described above are merely listed as examples, the two-dimensional materials that may be included in the semiconductor device of the present disclosure are not limited to the materials described above.

The back interlayer insulating film 290 may include, for example, at least one of silicon oxide, silicon nitride, silicon carbonitride, silicon oxynitride, and a low dielectric constant material. In an embodiment, a dielectric constant of the low dielectric constant material has a value smaller than 3.9, which is the dielectric constant of silicon oxide.

Each of the active patterns AP1, AP2, AP3 and AP4 may be disposed on the back interlayer insulating film 290. Each of the active patterns AP1, AP2, AP3, and AP4 may extend long in the first direction D1.

For example, each of the active patterns AP1, AP2, AP3 and AP4 may be disposed on the first back wiring line 50 and the second back wiring line 60. Each of the active patterns AP1, AP2, AP3 and AP4 may be disposed on the first surface 50_S1 of the first back wiring line and the first surface 50_S1 of the second back wiring line. The first surface 50_S1 of the first back wiring line 150 and the first surface 60_S1 of the second back wiring line 160 may face each of the active patterns AP1, AP2, AP3 and AP4.

Figure 2:
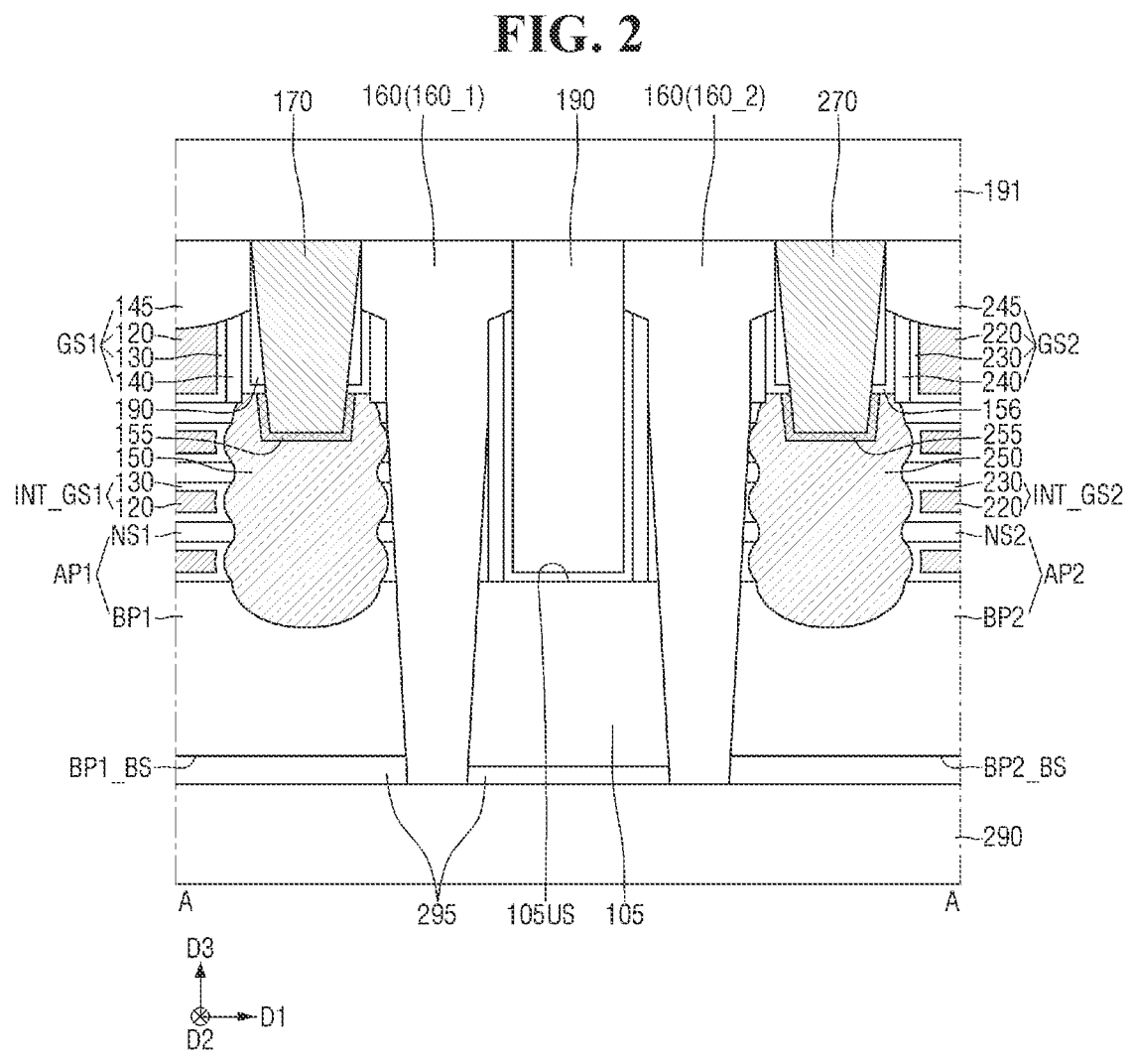

As shown in FIG. 2, the first active pattern AP1 may be spaced apart from the second active pattern AP2 in the first direction D1. The first active pattern AP1 and the second active pattern AP2 may be aligned in a row along the first direction D1.

The third active pattern AP3 may be spaced apart from the fourth active pattern AP4 in the first direction D1. The third active pattern AP3 and the fourth active pattern AP4 may be aligned in a row along the first direction D1.

As shown in FIG. 3, the first active pattern AP1 may be spaced apart from the third active pattern AP3 in the second direction D2. The second active pattern AP2 may be spaced apart from the fourth active pattern AP4 in the second direction D2.

The first active pattern AP1 and the second active pattern AP2 may be disposed in a region in which transistors of the same conductivity type are formed. The third active pattern AP3 and the fourth active pattern AP4 may be disposed in a region in which transistors of the same conductivity type are formed.

For example, the first active pattern AP1 may be disposed in a region in which a P-type transistor is formed. The third active pattern AP3 may be disposed in a region in which an N-type transistor is formed.

Each of the active patterns AP1, AP2, AP3 and AP4 may be a multi-channel active pattern. For example, as shown in FIG. 3, the first active pattern AP1 may include a first lower pattern BP1, and a plurality of first sheet patterns NS1. The second active pattern AP2 may include a second lower pattern BP2 and a plurality of second sheet patterns NS2. As shown in FIG. 3, the third active pattern AP3 may include a third lower pattern BP3 and a plurality of third sheet patterns NS3. Similarly, the fourth active pattern AP4 may include a fourth lower pattern and a plurality of fourth sheet patterns. In the semiconductor device according to an embodiment, each of the active patterns AP1, AP2, AP3 and AP4 is an active pattern including nanosheets or nanowires.

Contents regarding the third lower pattern BP3 described below may be applied to the fourth lower pattern. Contents regarding the third sheet pattern NS3 described below may be applied to the fourth sheet pattern.

Each of the lower patterns BP1, BP2 and BP3 may be disposed on the back interlayer insulating film 290. Each of the lower patterns BP1, BP2 and BP3 may protrude in the third direction D3. In an embodiment, each of the lower patterns BP1, BP2 and BP3 is a fin-shaped pattern.

Each of the lower patterns BP1, BP2, and BP3 may extend in the first direction D1. The first lower pattern BP1 may be spaced apart from the second lower pattern BP2 in the first direction D1. The third lower pattern BP3 may be spaced apart from the fourth lower pattern in the first direction D1. As shown in FIG. 3, the first lower pattern BP1 may be spaced apart from the third lower pattern BP3 in the second direction D2. The second lower pattern BP2 may be spaced apart from the fourth lower pattern in the second direction D2.

As shown in FIG. 3, the first lower pattern BP1 includes a first surface BP1_US and a second surface BP1_BS that are opposite to each other in the third direction D3. As further shown in FIG. 3, the third lower pattern BP3 includes a first surface BP3_US and a second surface BP3_BS that are opposite to each other in the third direction D3.

The second surface BP1_BS of the first lower pattern and the second surface BP3_BS of the third lower pattern may face the back interlayer insulating film 290, the first back wiring line 50 and the second back wiring line 60. The first back wiring line 50 and the second back wiring line 60 may be disposed on the second surface BP1_BS of the first lower pattern and the second surface BP3_BS of the third lower pattern.

As shown in FIG. 2, the second lower pattern BP2 may include a second surface BP2_BS that faces the back interlayer insulating film 290. The second lower pattern BP2 may include a first surface that is opposite to the second surface BP2_BS of the second lower pattern in the third direction D3. A fourth lower pattern included in the fourth active pattern AP4 may also include a first surface and a second surface that are opposite to each other in the third direction D3.

The first lower pattern BP1 will be described as an example. The second surface BP1_BS of the first lower pattern BP1 may be the lower surface of the first lower pattern BP1. The first surface BP1_US of the first lower pattern may be the upper surface of the first lower pattern BP1.

As shown in FIG. 3, the first lower pattern BP1 includes side walls BP1_SW that connect the first surface BP1_US of the first lower pattern and the second surface BP1_BS of the first lower pattern. As further shown in FIG. 3, the third lower pattern BP3 includes side walls BP3_SW that connects the first surface BP3_US of the third lower pattern and the second surface BP3_BS of the third lower pattern. The side wall BP1_SW of the first lower pattern and the side wall BP3_SW of the third lower pattern may extend in the first direction D1. The side wall BP1_SW of the first lower pattern BP1 and the side wall BP3_SW of the third lower pattern BP3 may each be defined by the fin trench FT. The second lower pattern BP2 and the fourth lower pattern may include side walls extending in the first direction D1.

The plurality of first sheet patterns NS1 may be disposed on the first lower pattern BP1. The plurality of first sheet patterns NS1 may be disposed on the first surface BP1_US of the first lower pattern. The plurality of first sheet patterns NS1 may be spaced apart from the first lower pattern BP1 in the third direction D3.

The plurality of second sheet patterns NS2 may be disposed on the second lower pattern BP2. The plurality of second sheet patterns NS2 may be disposed on the first surface of the second lower pattern BP2. The plurality of second sheet patterns NS2 may be spaced apart from the second lower patterns BP2 in the third direction D3.

The plurality of third sheet patterns NS3 may be disposed on the third lower pattern BP3. The plurality of third sheet patterns NS3 may be disposed on the first surface BP3_US of the third lower pattern. The plurality of third sheet patterns NS3 may be spaced apart from the third lower patterns BP3 in the third direction D3.

In the fourth active pattern AP4, a plurality of fourth sheet patterns may be disposed on the fourth lower pattern. The plurality of fourth sheet patterns may be spaced apart from the fourth lower pattern in the third direction D3. The sheet patterns NS1, NS2, and NS3 may be disposed on the first surface 50_S1 of the first back wiring line 50 and the first surface 60_S1 of the second back wiring line 60.

The sheet patterns NS1, NS2, and NS3 may each include an upper surface and a lower surface that are opposite to each other in the third direction D3. The lower surfaces of the sheet patterns NS1, NS2, and NS3 may face the first back wiring line 50 and the second back wiring line 60, respectively. Although the three sheet patterns NS1, NS2, and NS3 are shown as being disposed in the third direction D3, this is only for convenience of explanation since embodiments of the disclosure are not limited thereto.

Each of the sheet patterns NS1, NS2 and NS3 may include an uppermost sheet pattern that is furthest from the respective lower patterns BP1, BP2 and BP3. For example, the upper surfaces of the active patterns AP1, AP2 and AP3 may be the upper surface of the uppermost sheet pattern among the sheet patterns NS1, NS2 and NS3. The upper surface of the fourth active pattern AP4 may be the upper surface of the uppermost sheet pattern among the fourth sheet patterns.

Each of the lower patterns BP1, BP2 and BP3 may include silicon or germanium which is an elemental semiconductor material. Also, each of the lower patterns BP1, BP2 and BP3 may include a compound semiconductor, and may include, for example, a group IV-IV compound semiconductor or a group III-V compound semiconductor.

The group IV-IV compound semiconductor may be, for example, a binary compound and a ternary compound containing at least two of carbon (C), silicon (Si), germanium (Ge), and tin (Sn) or compounds obtained by doping these elements with a group IV element.

The group III-V compound semiconductor may be, for example, one of a binary compound, a ternary compound or a quaternary compound formed by combining at least one of aluminum (Al), gallium (Ga) and indium (In) as one of a group III element with phosphorus (P), arsenic (As) and antimony (Sb) as a group V element.

Each of the sheet patterns NS1, NS2 and NS3 may include one of silicon or germanium as an elemental semiconductor material, a group IV-IV compound semiconductor or a group III-V compound semiconductor. The first sheet pattern NS1 will be described as an example. In an embodiment a width of the first sheet pattern NS1 in the second direction D2 increases in proportion to a width of the first lower pattern BP1 in the second direction D2. Although each first sheet pattern NS1 disposed on the first lower pattern BP1 is shown in FIG. 3 to have the same width in the second direction D2, embodiments of the disclosure are not limited thereto.

The field insulating film 105 may be disposed on the first back wiring line 50 and the second back wiring line 60. For example, the field insulating film 105 may be disposed on the first surface 50_S1 of the first back wiring line 50 and the first surface 60_S1 of the second back wiring line 60.

The first lower pattern BP1 and the third lower pattern BP3 will be described as an example. The field insulating film 105 may be disposed on the side walls BP1_SW of the first lower pattern BP1 and the side walls BP3_SW of the third lower pattern BP3. As an example, the field insulating film 105 may cover the entire side walls BP1_SW of the first lower pattern BP1, and the side walls BP3_SW of the third lower pattern BP3. Unlike the shown example, in another example, the field insulating film 105 may cover a part of the side wall BP1_SW of the first lower pattern BP1 and/or a part of the side wall BP3_SW of the third lower pattern BP3.

In an embodiment, the field insulating film 105 does not cover the first surface BP1_US of the first lower pattern and the first surface BP3_US of the third lower pattern. In an embodiment, the field insulating film 105 does not cover the first surface of the second lower pattern BP2 and the first surface of the fourth lower pattern BP2. On the basis of the first back wiring line 50 and the second back wiring line 60, each of the sheet patterns NS1, NS2 and NS3 may be disposed to be higher than the upper surface 105US of the field insulating film 105.

The field insulating film 105 may include, for example, an oxide film, a nitride film, an oxynitride film or a combination film thereof. Although the field insulating film 105 is shown in FIG. 3 as a single film, this is merely for convenience of explanation, and embodiments of the disclosure are not limited thereto.

An insertion insulating film 295 may be disposed between the back interlayer insulating film 290 and the lower patterns BP1, BP2 and BP3. The insertion insulating film 295 may be disposed between the back interlayer insulating film 290 and the field insulating film 105. The insertion insulating film 295 may also be disposed between the back interlayer insulating film 290 and the fourth lower pattern. The insertion insulating film 295 may be disposed on the first surface 50_S1 of the first back wiring line 50 and the first surface 60_S1 of the second back wiring line 60.

The insertion insulating film 295 may be disposed on the second surface BP1_BS of the first lower pattern BP1, the second surface BP2_BS of the second lower pattern BP2, and the second surface BP3_BS of the third lower pattern BP3. In an embodiment, the insertion insulating film 295 contacts the second surface BP1_BS of the first lower pattern BP1, the second surface BP2_BS of the second lower pattern BP2, and the second surface BP3_BS of the third lower pattern BP3.

The insertion insulating film 295 may include, for example, at least one of silicon oxide, silicon nitride, silicon carbonitride, silicon oxynitride, and a low dielectric constant material. Although a boundary between the insertion insulating film 295 and the back interlayer insulating film 290 is shown as being distinguished from a boundary between the insertion insulating film 295 and the field insulating film 105, embodiments of the disclosure are not limited thereto. When the insertion insulating film 295 and the back interlayer insulating film 290 include the same material, the boundary between the insertion insulating film 295 and the back interlayer insulating film 290 may not be distinguished. When the insertion insulating film 295 and the field insulating film 105 include the same material, the boundary between the insertion insulating film 295 and the field insulating film 105 may not be distinguished.

As shown in FIG. 2, a first gate structure GS1 and a second gate structure GS2 are disposed on the upper surface 105US of the field insulating film. The first gate structure GS1 and the second gate structure GS2 may each extend in the second direction D2.

A plurality of the first gate structure GS1 may be present. The first gate structures GS1 may be disposed to be spaced apart from one another in the first direction D1. The first gate structures GS1 may be adjacent to each other in the first direction D1.

The second gate structures GS2 may be disposed to be spaced apart in the first direction D1. The second gate structures GS2 may be adjacent to each other in the first direction D1.

The first gate structure GS1 may be disposed on the first active pattern AP1 and the third active pattern AP3. The first gate structure GS1 may intersect the first active pattern AP1 and the third active pattern AP3.

The first gate structure GS1 may intersect the first lower pattern BP1 and the third lower pattern BP3. The first gate structure GS1 may wrap or surround each first sheet pattern NS1. The first gate structures GS1 may wrap or surround each third sheet pattern NS3.

The second gate structure GS2 may be disposed on the second active pattern AP2 and the fourth active pattern AP4. The second gate structure GS2 may intersect the second active pattern AP2 and the fourth active pattern AP4.

The second gate structure GS2 may intersect the second lower pattern BP2 and the fourth lower pattern. The second gate structure GS2 may wrap or surround each second sheet pattern NS2. The second gate structure GS2 may wrap each fourth sheet pattern.

Although the first gate structure GS1 is shown to be disposed over the first active pattern AP1 and the third active pattern AP3, embodiments of the disclosure are not limited thereto. Unlike the shown example, in an embodiment, a part of the first gate structure GS1 is separated into two portions by a gate isolation structure disposed on the field insulating film 105, and may be disposed on the first active pattern AP1 and the third active pattern AP3. The above description of the first gate structure GS1 may be applied to the second gate structure GS2.

As shown in FIG. 2, the first gate structure GS1 may include, for example, a first gate electrode 120, a first gate insulating film 130, a first gate spacer 140, and a first gate capping pattern 145. As further shown in FIG. 2, the second gate structure GS2 may include, for example, a second gate electrode 220, a second gate insulating film 230, a second gate spacer 240, and a second gate capping pattern 245.

The first gate structures GS1 may include a plurality of first inner gate structures INT_GS1 disposed between the first sheet patterns NS1 adjacent in the third direction D3, and between the first lower patterns BP1 and the first sheet patterns NS1. The first inner gate structure INT_GS1 may be disposed between the first surface BP1_US of the first lower pattern BP1 and the lower surface of the first sheet pattern NS1, and between the upper surface of the first sheet pattern NS1 and the lower surface of the first sheet pattern NS1 facing each other in the third direction D3.

The number of first inner gate structures INT_GS1 may be equal to the number of first sheet patterns NS1. In an embodiment, the first inner gate structure INT_GS1 is in contact with the first surface BP1_US of the first lower pattern BP1, the upper surface of the first sheet pattern NS1, and the lower surface of the first sheet pattern NS1.

The first inner gate structure INT_GS1 includes the first gate electrode 120 and the first gate insulating film 130 disposed between the adjacent first sheet patterns NS1, and between the first lower pattern BP1 and the first sheet pattern NS1. The first inner gate structure INT_GS1 may be disposed between the third sheet patterns NS3 adjacent in the third direction D3, and between the third lower pattern BP3 and the third sheet pattern NS3.

The second gate structures GS2 may include a plurality of second inner gate structures INT_GS2 disposed between the second sheet patterns NS2 adjacent in the third direction D3, and between the second lower pattern BP2 and the second sheet pattern NS2. The second inner gate structure INT_GS2 may be disposed between the fourth sheet patterns adjacent in the third direction D3, and between the fourth lower pattern and the fourth sheet pattern. The description of the second inner gate structure INT_GS2 may be the same or substantially the same as the description of the first inner gate structure INT_GS1.

The following description will focus on the first active pattern AP1, the first gate structure GS1, and the third active pattern AP3 and the first gate structure GS1. The description of the second gate structure GS2 may be the same or substantially the same as the description of the first gate structure GS1.

The first gate electrode 120 may be disposed on the first lower pattern BP1 and the third lower pattern BP3. For example, the first gate electrode 120 may be disposed on the first surface BP1_US of the first lower pattern BP1 and the first surface BP3_US of the third lower pattern BP3.

The first gate electrode 120 may extend in the second direction D2. The first gate electrode 120 may intersect the first lower pattern BP1 and the third lower pattern BP3. The first gate electrode 120 may wrap or surround the first sheet pattern NS1 and the third sheet pattern NS3.

Although the upper surface of the first gate electrode 120 is shown as a concave curved surface in the cross-sectional view such as FIG. 2, embodiments of the present disclosure are not limited thereto. For example, the upper surface of the first gate electrode 120 may be a flat surface.

The first gate electrode 120 and the second gate electrode 220 may include at least one of metal, metal alloy, conductive metal nitride, metal silicide, doped semiconductor material, conductive metal oxide, and conductive metal oxynitride. The first gate electrode 120 and the second gate electrode 220 may include, for example, but are not limited to, at least one of titanium nitride (TiN), tantalum carbide (TaC), tantalum nitride (TaN), titanium silicon nitride (Ti-SiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC-N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and combinations thereof. The conductive metal oxide and the conductive metal oxynitride may include, but are not limited to, oxidized forms of the aforementioned materials.

The first gate insulating film 130 may extend along the upper surface 105US of the field insulating film, the first surface BP1_US of the first lower pattern BP1, and the first surface BP3_US of the third lower pattern BP3. The first gate insulating film 130 may wrap or surround the plurality of first sheet patterns NS1. The first gate insulating film 130 may wrap or surround the plurality of third sheet patterns NS3. The first gate insulating film 130 may be disposed along the periphery of the first sheet pattern NS1 and the periphery of the third sheet pattern NS3. The first gate electrode 120 is disposed on the first gate insulating film 130.

The first gate insulating film 130 is disposed between the first gate electrode 120 and the first sheet pattern NS1, and between the first gate electrode 120 and the third sheet pattern NS3. In the semiconductor device according to an embodiment, the first gate insulating film 130 included in the first inner gate structure INT_GS1 contacts the first source/drain pattern 150, which will be described below.

The first gate insulating film 130 and the second gate insulating film 230 may include silicon oxide, silicon oxynitride, silicon nitride or a high dielectric constant material having a higher dielectric constant than silicon oxide. The high dielectric constant material may include, for example, one or more of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide or lead zinc niobate.

Although the first gate insulating film 130 and the second gate insulating film 230 are shown as single films, this is merely for convenience of explanation, and embodiments of the disclosure are not limited thereto. The first gate insulating film 130 and the second gate insulating film 230 may include a plurality of films. The first gate insulating film 130 will be described as an example. The first gate insulating film 130 may include an interfacial layer disposed between the first active pattern AP1 and the first gate electrode 120, and between the third active pattern AP3 and the first gate electrode 120, and a high dielectric constant insulating film. In an embodiment, the interfacial layer is not formed along a profile of the upper surface 105US of the field insulating film 105.

The semiconductor device according to an embodiment includes a Negative Capacitance (NC) FET that includes a negative capacitor. For example, the first gate insulating film 130 and the second gate insulating film 230 may include a ferroelectric material film having ferroelectric properties, and a paraelectric material film having paraelectric properties.

The ferroelectric material film may have a negative capacitance, and the paraelectric material film may have a positive capacitance. For example, if two or more capacitors are connected in series and the capacitance of each capacitor has a positive value, the overall capacitances decrease from the capacitance of each of the individual capacitors. On the other hand, if at least one of two or more capacitors connected in series has a negative value, the overall capacitance may be greater than an absolute value of each of the individual capacitances, while having a positive value.

When the ferroelectric material film having the negative capacitance and the paraelectric material film having the positive capacitance are connected in series, the overall capacitance values of the ferroelectric material film and the paraelectric material film connected in series may increase. By the use of the increased overall capacitance values, a transistor including the ferroelectric material film may have a subthreshold swing (SS) below 60 mV/decade at room temperature.

The ferroelectric material film may have ferroelectric properties. The ferroelectric material film may include, for example, at least one of hafnium oxide, hafnium zirconium oxide, barium strontium titanium oxide, barium titanium oxide, and lead zirconium titanium oxide. Here, as an example, the hafnium zirconium oxide may be a material obtained by doping hafnium oxide with zirconium (Zr). As another example, the hafnium zirconium oxide may be a compound of hafnium (Hf), zirconium (Zr), and oxygen (O).

The ferroelectric material film may further include a doped dopant. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and tin (Sn). The type of dopant included in the ferroelectric material film may vary, depending on which type of ferroelectric material is included in the ferroelectric material film.

When the ferroelectric material film includes hafnium oxide, the dopant included in the ferroelectric material film may include, for example, at least one of gadolinium (Gd), silicon (Si), zirconium (Zr), aluminum (Al), and yttrium (Y).

When the dopant is aluminum (Al), the ferroelectric material film may include 3 to 8 atomic % (at %) aluminum. Here, a ratio of the dopant may be a ratio of aluminum to the sum of hafnium and aluminum.

When the dopant is silicon (Si), the ferroelectric material film may include 2 to 10 at % silicon. When the dopant is yttrium (Y), the ferroelectric material film may include 2 to 10 at % yttrium. When the dopant is gadolinium (Gd), the ferroelectric material film may include 1 to 7 at % gadolinium. When the dopant is zirconium (Zr), the ferroelectric material film may include 50 to 80 at % zirconium.

The paraelectric material film may have the paraelectric properties. The paraelectric material film may include at least one of, for example, a silicon oxide and a metal oxide having a high dielectric constant. The metal oxide included in the paraelectric material film may include, for example, but is not limited to, at least one of hafnium oxide, zirconium oxide, and aluminum oxide.

The ferroelectric material film and the paraelectric material film may include the same material. The ferroelectric material film has ferroelectric properties, but the paraelectric material film does not have ferroelectric properties. For example, when the ferroelectric material film and the paraelectric material film include hafnium oxide, a crystal structure of hafnium oxide included in the ferroelectric material film is different from a crystal structure of hafnium oxide included in the paraelectric material film.

The ferroelectric material film may have a thickness having the ferroelectric properties. The thickness of the ferroelectric material film may be, for example, but is not limited to, 0.5 to 10 nm. Since a critical thickness that exhibits the ferroelectric properties may vary for each ferroelectric material, the thickness of the ferroelectric material film may vary depending on the ferroelectric material.

As an example, the first gate insulating film 130 and the second gate insulating film 230 may include a single ferroelectric material film. As another example, the first gate insulating film 130 and the second gate insulating film 230 may include a plurality of ferroelectric material films spaced apart from one another. The first gate insulating film 130 and the second gate insulating film 230 may have a stacked film structure in which a plurality of ferroelectric material films and a plurality of paraelectric material films are alternately stacked. For example, the ferroelectric material films may be interleaved with the paraelectric material films.

A first gate spacer 140 may be disposed on side walls of the first gate electrode 120. For example, the first gate spacer 140 may be disposed on long side walls of the first gate electrode 120 extending in the second direction D2. For example, the first gate spacer 140 may be disposed on the longer side walls of the first gate electrode 120. In an embodiment, the first gate spacers 140 are not disposed between the first lower pattern BP1 and the first sheet pattern NS1, and are not disposed between the first sheet patterns NS1 adjacent to each other in the third direction D3. A second gate spacer 240 may be disposed on side walls of the second gate electrode 220.

In an embodiment, the second gate spacer 240 are not disposed between the second lower pattern BP2 and the second sheet pattern NS2, and are not disposed between the second sheet patterns NS2 adjacent to each other in the third direction D3.

Unlike the shown example, the first gate spacer 140 and/or the second gate spacer 240 may include an inner spacer. The inner spacer may be disposed between the first lower pattern BP1 and the first sheet pattern NS1, and between the first sheet patterns NS1 adjacent to each other in the third direction D3. Alternatively, the inner spacer may be disposed between the second lower pattern BP2 and the second sheet pattern NS2, and between the second sheet patterns NS2 adjacent to each other in the third direction D3.

The first gate spacer 140 and the second gate spacer 240 may include, for example, at least one of silicon nitride (SiN), silicon oxynitride (SiON), silicon oxide (SiO$_2$), silicon oxycarbonitride (SiOCN), silicon boronitride (SiBN), silicon oxyboronitride (SiOBN), silicon oxycarbide (SiOC), and combinations thereof. Although the first gate spacer 140 and the second gate spacer 240 are shown as being single films, this is merely for convenience of explanation, and embodiments of the disclosure are not limited thereto.

A first gate capping pattern 145 may be disposed on the first gate electrode 120. An upper surface of the first gate capping pattern 145 may be the upper surface of the first gate structure GS1. A second gate capping pattern 245 may be disposed on the second gate electrode 220. An upper surface of the second gate capping pattern 245 may be the upper surface of the second gate structure GS2.

Unlike the shown example, the first gate capping pattern 145 may be disposed between the first gate spacers 140. The second gate capping pattern 245 may be disposed between the second gate spacers 240.

The first gate capping pattern 145 and the second gate capping pattern 245 may include, for example, at least one of silicon nitride (SiN), silicon oxynitride (SiON), silicon carbonitride (SiCN), silicon oxycarbonitride (SiOCN), and combinations thereof.

Unlike the shown example, in an embodiment, the first gate structure GS1 and the second gate structure GS2 do not include the gate capping patterns 145 and 245. For example, in an alternate embodiment, the gate capping patterns 145 and 245 may be omitted.

A first source/drain pattern 150 may be disposed on the first lower pattern BP1. For example, the first source/drain pattern 150 may be disposed on the first surface BP1_US of the first lower pattern BP1. The first source/drain pattern 150 may be disposed on a side surface of the first gate electrode 120. The first source/drain pattern 150 may be in contact with the first active pattern AP1. The first source/drain pattern 150 may be in contact with the first sheet pattern NS1. The first source/drain pattern 150 is connected to the first sheet pattern NS1 and the first lower pattern BP1. For example, the first source/drain pattern 150 may be in contact with the first inner gate structure INT_GS1.

A second source/drain pattern 250 may be disposed on the second lower pattern BP2. For example, the second source/drain pattern 250 may be disposed on the first surface of the second lower pattern BP2. The second source/drain pattern 250 may be disposed on a side surface of the second gate electrode 220. The second source/drain pattern 250 may be in contact with the second active pattern AP2. The second source/drain pattern 250 may be in contact with the second sheet pattern NS2. The second source/drain pattern 250 is connected to the second sheet pattern NS2 and the second lower pattern BP2. For example, the second source/drain pattern 250 may be in contact with the second inner gate structure INT_GS2.

Figure 4:
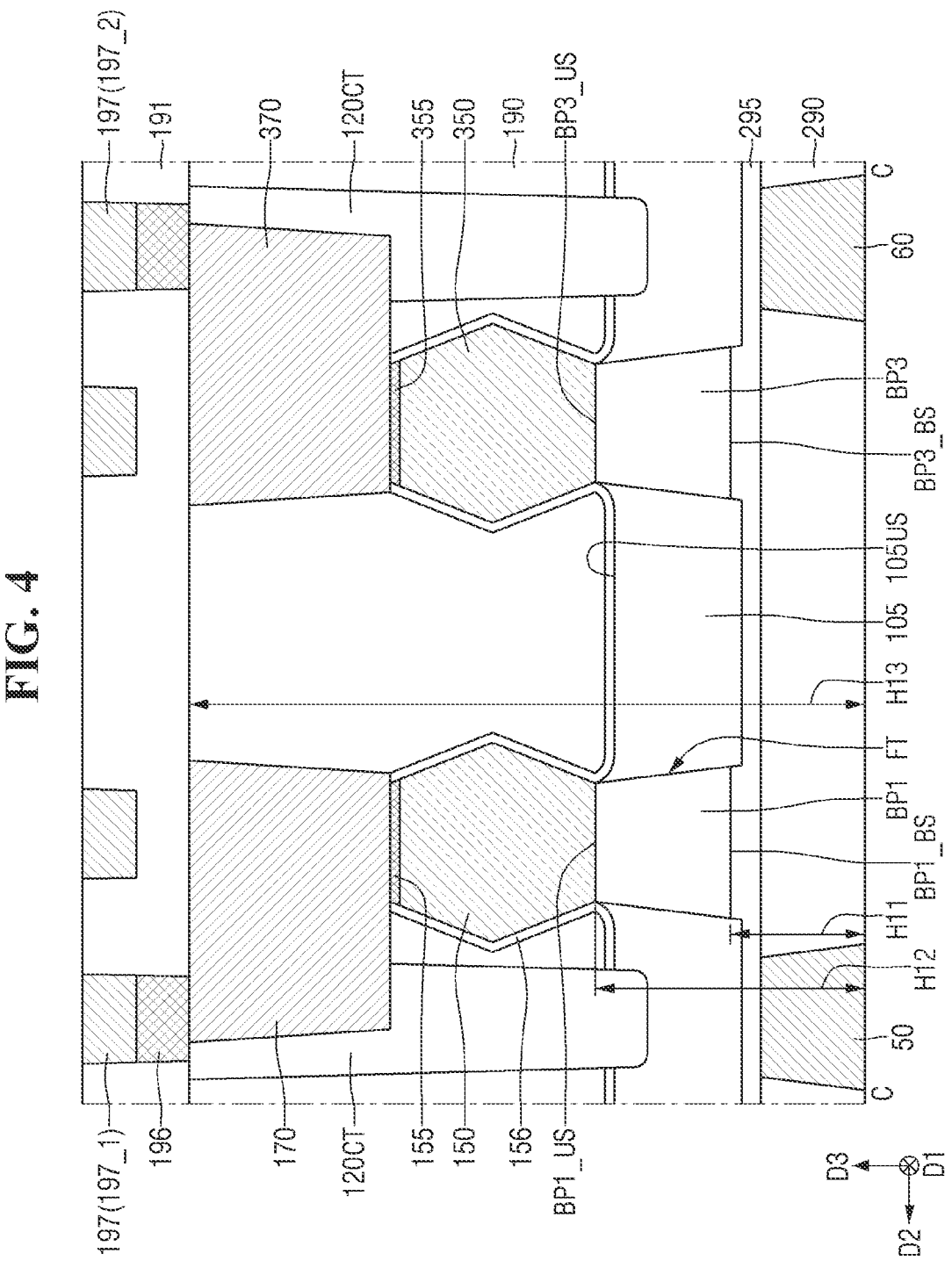

As shown in FIG. 4, a third source/drain pattern 350 may be disposed on the third lower pattern BP3. For example, the third source/drain pattern 350 may be disposed on the first surface BP3_US of the third lower pattern BP3. The third source/drain pattern 350 may be disposed on the side surface of the first gate electrode 120. The third source/drain pattern 350 may be in contact with the third sheet pattern NS3.

A fourth source/drain pattern may be disposed on the fourth lower pattern. The fourth source/drain pattern may be disposed on the side surface of the second gate electrode 220. The fourth source/drain pattern may be in contact with the fourth sheet pattern.

For example, a cross-sectional view taken in the first direction D1 along the third active pattern AP3 and the fourth active pattern AP4 may be similar to that of FIG. 2. The third source/drain pattern 350 may be in contact with the first gate insulating film 130 included in the first inner gate structure INT_GS1. The fourth source/drain pattern may be in contact with the second gate insulating film 230 included in the second inner gate structure INT_GS2.

As another example, an inner spacer may be further disposed between the first inner gate structure INT_GS1 and the third source/drain pattern 350, and between the second inner gate structure INT_GS2 and the fourth source/drain pattern 350. In such a case, the third source/drain pattern 350 is not in contact with the first gate insulating film 130 included in the first inner gate structure INT_GS1. In this case, the fourth source/drain pattern is not in contact with the second gate insulating film 230 included in the second inner gate structure INT_GS2.

The source/drain patterns 150, 250 and 350 may be disposed on the first surface 50_S1 of the first back wiring line 50 and the first surface 60_S1 of the second back wiring line 60. Since the first lower pattern BP1 is spaced apart from the second lower pattern BP2 in the first direction D1, the first source/drain pattern 150 is spaced apart from the second source/drain pattern 250 in the first direction D1. The third source/drain pattern 350 is spaced apart from the fourth source/drain pattern 150 in the first direction D1. The first source/drain pattern 150 is spaced apart from the third source/drain pattern 350 in the second direction D2. The second source/drain pattern 250 is spaced apart from the fourth source/drain pattern in the second direction D2.

The first source/drain pattern 150 may be included in the source/drain of a transistor that uses the first sheet pattern NS1 as a channel region. The second source/drain pattern 250 may be included in the source/drain of the transistor that uses the second sheet pattern NS2 as a channel region. The third source/drain pattern 350 may be included in the source/drain of the transistor that uses the third sheet pattern NS3 as a channel region. A fourth source/drain pattern may be included in the source/drain of a transistor that uses the fourth sheet pattern as a channel region.

Each of the source/drain patterns 150, 250 and 350 may include an epitaxial pattern. Each of the source/drain patterns 150, 250 and 350 may include a semiconductor material.

The first source/drain pattern 150 and the second source/drain pattern 250 may include p-type dopants. The p-type dopants may include, but are not limited to, at least one of boron (B) and gallium (Ga). The third source/drain pattern 350 and the fourth source/drain pattern may include n-type dopants. The n-type dopant may include, but is not limited to, at least one of phosphorus (P), arsenic (As), antimony (Sb) and bismuth (Bi).

As shown in FIG. 2 and FIG. 4, the source/drain etching stop film 156 may extend along the outer walls of the gate spacers 140 and side walls of the source/drain patterns 150, 250 and 350. The source/drain etching stop film 156 may extend along the upper surface 105US of the field insulating film 105.

In an embodiment, the source/drain etching stop film 156 does not extend along side walls of the first gate capping pattern 145 and side walls of the second gate capping pattern 245. Unlike the shown example, in an embodiment, the source/drain etching stop film 156 extends along side walls of the first gate capping pattern 145 and side walls of the second gate capping pattern 245.

The source/drain etching stop film 156 may include, for example, at least one of silicon nitride (SiN), silicon oxynitride (SiON), silicon oxycarbonitride (SiOCN), silicon boronitride (SiBN), silicon oxyboronitride (SiOBN), silicon oxycarbide (SiOC), and combinations thereof.

As shown in FIG. 2, a pair of first element isolation structures 160 may be disposed on the back interlayer insulating film 290, the first back wiring line 50, and the second back wiring line 60. The first element isolation structure 160 may be disposed on the first surface 50_S1 of the first back wiring line 50 and the first surface 60_S1 of the second back wiring line 60.

A pair of the first element isolation structure 160 may be present. The pair of first element isolation structures 160 may include a first sub-element isolation structure 160_1 and a second sub-element isolation structure 160_2. The first sub-element isolation structure 160_1 and the second sub-element isolation structure 160_2 may each extend in the second direction D2. The first sub-element isolation structure 160_1 may be spaced apart from the second sub-element isolation structure 160_2 in the first direction D1.

The first element isolation structure 160 may isolate the first lower pattern BP1 and the second lower pattern BP2. The first element isolation structure 160 may isolate the third lower pattern BP3 and the fourth lower pattern. For example, the first element isolation structure 160 may prevent the first lower pattern BP1 from becoming electrically connected to the second lower pattern BP2 and prevent from the third lower pattern BP3 from becoming electrically connected to the fourth lower pattern. In an embodiment, the first active pattern AP1 and the second active pattern AP2 are not disposed between the first sub-element isolation structure 160_1 and the second sub-element isolation structure 160_2. For example, the first lower pattern BP1 and the second lower pattern BP2 are not disposed between the first sub-element isolation structure 160_1 and the second sub-element isolation structure 160_2. A part of the field insulating film 105 may be disposed between the first sub-element isolation structure 160_1 and the second sub-element isolation structure 160_2 adjacent to each other in the first direction D1.

Unlike the shown example, in an embodiment, a dummy active pattern including a semiconductor material is disposed between the first sub-element isolation structure 160_1 and the second sub-element isolation structure 160_2.

The first lower pattern BP1 may protrude from the first sub-element isolation structure 160_1 in the first direction D1. The second lower pattern BP2 may protrude from the second sub-element isolation structure 160_2 in the first direction D1. The third lower pattern BP3 may protrude from the first sub-element isolation structure 160_1 in the first direction D1. The fourth lower pattern may protrude from the second sub-element isolation structure 160_2 in the first direction D1.

In an embodiment, a height of the upper surface of the first sub-element isolation structure 160_1 is equal to a height of the upper surface of the first gate capping pattern 145, on the basis of the second surface BP1_BS of the first lower pattern BP1. Unlike the shown example, in an embodiment, the upper surface of the first sub-element isolation structure 160_1 is higher than the upper surface of the first gate capping pattern 145, on the basis of the second surface BP1_BS of the first lower pattern BP1.

In an embodiment, the first element isolation structure 160 includes or is an insulating material. The first element isolation structure 160 may include, for example, at least one of silicon nitride (SiN), silicon oxynitride (SiON), silicon oxide (SiO$_2$), silicon oxycarbonitride (SiOCN), silicon boronitride (SiBN), silicon oxyboronitride (SiOBN), silicon oxycarbide (SiOC), and combinations thereof. Although the first sub-element isolation structure 160_1 and the second sub-element isolation structure 160_2 are shown as single films, embodiments of the disclosure are not limited thereto.

An insulating residual pattern may be disposed between the first sub-element isolation structure 160_1 and the first source/drain pattern 150. An insulating residual pattern may be disposed between the second sub-element isolation structure 160_2 and the second source/drain pattern 250. The insulating residual pattern may include the same material as the gate insulating films 130 and 230.

A first upper interlayer insulating film 190 and a source/drain etching stop film 156 may be disposed between the first sub-element isolation structure 160_1 and the second sub-element isolation structure 160_2. For example, an insulating spacer pattern that is in contact with the source/drain etching stop film 156 may be disposed between the first sub-element isolation structure 160_1 and the source/drain etching stop film 156. The insulating spacer pattern may include the same material as the first gate spacer 140.

As an example, the first source/drain pattern 150 and the third source/drain pattern 350 may be disposed between the first gate electrodes 120 adjacent in the first direction D1. As another example, the first source/drain pattern 150 and the third source/drain pattern 350 may be disposed between the first gate electrode 120 and the first sub-element isolation structure 160_1.

As an example, the second source/drain pattern 250 and the fourth source/drain pattern may be disposed between the second gate electrodes 220 adjacent in the first direction D1. As another example, the second source/drain pattern 250 and the fourth source/drain pattern may be disposed between the second gate electrode 220 and the second sub-element isolation structure 160_2.

As shown in FIG. 3, a gate isolation structure 120CT may be disposed on the field insulating film 105. A part of the gate isolation structure 120CT may enter or penetrate the field insulating film 105.

A plurality of the gate isolation structure 120CT may be present. The gate isolation structures 120CT may be disposed to be spaced apart in the second direction D2. The active patterns AP1, AP2, AP3 and AP4 may be disposed between the first gate isolation structures GCS1 adjacent in the second direction D2.

The first gate electrode 120 and the second gate electrode 220 may be disposed between the gate isolation structures 120CT adjacent in the second direction D2. The gate isolation structure 120CT may isolate the gate electrodes adjacent in the second direction D2. In an embodiment when the first gate electrode 120 and the second gate electrode 220 include shorter side walls extending in the first direction D1, the shorter side wall of the first gate electrode 120 and the short side wall of the second gate electrode 220 face the gate isolation structure 120CT.

For example, the gate isolation structure 120CT may be disposed along the boundary of the standard cells. For example, the gate isolation structure 120CT may be a standard cell isolation structure.

The gate isolation structure 120CT may include, for example, at least one of silicon nitride (SiN), silicon oxynitride (SiON), silicon oxide ($SiO_2$), silicon oxycarbonitride (SiOCN), silicon boronitride (SiBN), silicon oxyboronitride (SiOBN), silicon oxycarbide (SiOC), aluminum oxide (AlO), and combinations thereof. Although the gate isolation structure 120CT is shown as being a single film, embodiments of the disclosure are not limited thereto.

The upper surface of the gate isolation structure 120CT may be located on the same plane as the upper surface of the first gate capping pattern 145, but embodiments of the disclosure are not limited thereto.

As shown in FIG. 2, a first upper interlayer insulating film 190 is disposed on the upper surface 105US of the field insulating film 105. As shown in FIG. 4, the first upper interlayer insulating film 190 is disposed on the source/drain etching stop film 156. The first upper interlayer insulating film 190 may be disposed on the source/drain patterns 150, 250 and 350.

In an embodiment, the first upper interlayer insulating film 190 does not cover the upper surface of the first gate capping pattern 145 and the upper surface of the second gate capping pattern 245. The first upper interlayer insulating film 190 may include, for example, at least one of silicon oxide, silicon nitride, silicon oxynitride, and a low dielectric constant material.

The first source/drain contact 170 may be disposed on the upper surface 105US of the field insulating film 105. The first source/drain contact 170 may be disposed on the first source/drain pattern 150. The first source/drain contact 170 is electrically connected to the first source/drain pattern 150.

The first source/drain contact 170 may be connected to the first back wiring line 50 through the first contact connecting via 180. In an embodiment, a part of the first source/drain contact 170 is not connected to the first contact connecting via 180.

The second source/drain contact 270 may be disposed on the upper surface 105US of the field insulating film 105. The second source/drain contact 270 may be disposed on the second source/drain pattern 250. The second source/drain contact 270 is electrically connected to the second source/drain pattern 250.

The second source/drain contact 270 may be connected to the first back wiring line 50 through the first contact connecting via 180. In an embodiment, a part of the second source/drain contact 270 is not connected to the first contact connecting via 180.

The third source/drain contact 370 may be disposed on the upper surface 105US of the field insulating film 105. The third source/drain contact 370 may be disposed on the third source/drain pattern 350. The third source/drain contact 370 is electrically connected to the third source/drain pattern 350.

The third source/drain contact 370 may be connected to the second back wiring line 60 through the second contact connecting via 280. In an embodiment, a part of the third source/drain contact 370 is not connected to the second contact connecting via 280.

The fourth source/drain contact 470 may be disposed on the upper surface 105US of the field insulating film 105. The fourth source/drain contact 470 may be disposed on the fourth source/drain pattern. The fourth source/drain contact 470 is electrically connected to the fourth source/drain pattern.

The fourth source/drain contact 470 may be connected to the second back wiring line 60 through the second contact connecting via 280. In an embodiment, a part of fourth source/drain contact 470 is not connected to the second contact connecting via 280.

Figure 5:
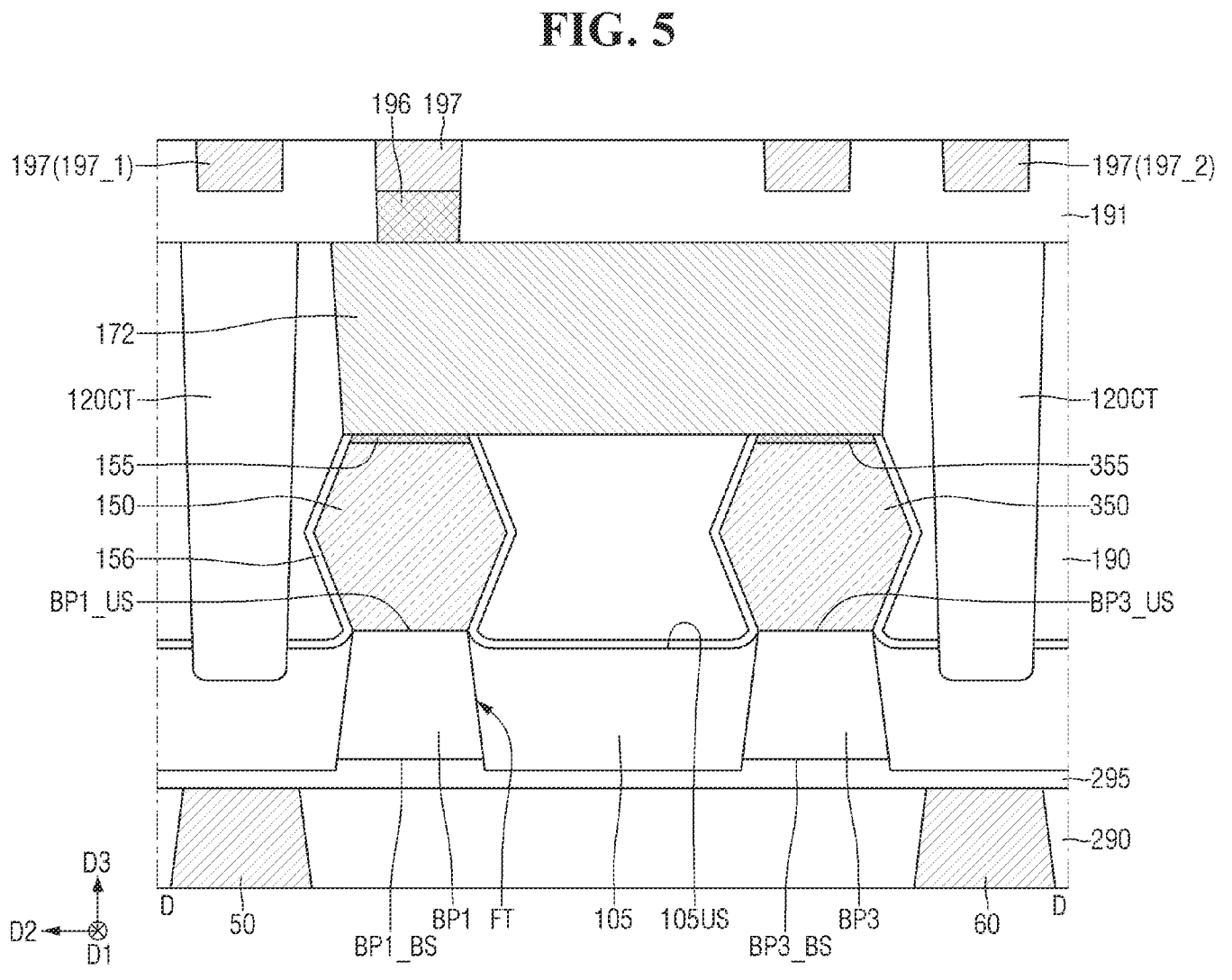

As shown in FIG. 5, the first connecting source/drain contact 172 may be disposed on the first source/drain pattern 150 and the third source/drain pattern 350. The first connecting source/drain contact 172 is electrically connected to the first source/drain pattern 150 and the third source/drain pattern 350.

The second connecting source/drain contact 272 may be disposed on the second source/drain pattern 250 and the fourth source/drain pattern. The second connecting source/drain contact 272 is electrically connected to the second source/drain pattern 250 and the fourth source/drain pattern. In an embodiment, the first connecting source/drain contact 172 and the second connecting source/drain contact 272 are not electrically connected to the first back wiring line 50 and the second back wiring line 60.

In an embodiment, a height of the upper surface of the first source/drain contact 170 is the same as a height of the upper surface of the second source/drain contact 270, on the basis of the upper surface 105US of the field insulating film 105. In an embodiment, the height of the upper surface of the first source/drain contact 170 is the same as the height of the upper surface of the third source/drain contact 370 and the height of the upper surface of the fourth source/drain contact 470, on the basis of the upper surface 105US of the field insulating film 105.

As shown in FIG. 4 and FIG. 5, a first contact silicide film 155 may be disposed between the first source/drain contact 170 and the first source/drain pattern 150, and between the first connecting source/drain contact 172 and the first source/drain pattern 150. As shown in FIG. 4 and FIG. 5, a second contact silicide film 255 may be disposed between the second source/drain contact 270 and the second source/drain pattern 250, and between the second connecting source/drain contact 272 and the second source/drain pattern 250. As shown in FIG. 4 and FIG. 5, a third contact silicide film 355 may be disposed between the third source/drain contact 370 and the third source/drain pattern 350, and between the first connecting source/drain contact 172 and the third source/drain pattern 350. A contact silicide film may also be disposed between the fourth source/drain contact 470 and the fourth source/drain pattern, and between the second connecting source/drain contact 272 and the fourth source/drain pattern.

As shown in FIG. 3, a first gate contact 175 is disposed on the first gate electrode 120. The first gate contact 175 may penetrate the first gate capping pattern 145. The first gate contact 175 is connected to the first gate electrode 120. The first gate contact 175 connects the front wiring line 197 to the first gate electrode 120. A second gate contact 275 may be disposed on the second gate electrode 220. The second gate contact 275 connects the front wiring line 197 and the second gate electrode 220.

Although the source/drain contacts 170, 270, 370 and 470 and the connecting source/drain contacts 172 and 272 are shown to have a single conductive film structure, embodiments of the disclosure are not limited thereto. Unlike the shown example, the source/drain contacts 170, 270, 370 and 470 and the connecting source/drain contacts 172 and 272 may have multiple conductive film structures, including a contact barrier film and a contact plug film.

Although the gate contacts 175 and 275 are shown to have a single conductive film structure, embodiments of the disclosure are not limited thereto. The gate contacts 175 and 275 may have multiple conductive film structure, including a contact barrier film and a contact plug film, unlike the shown example.

The source/drain contacts 170, 270, 370 and 470, the connecting source/drain contacts 172 and 272, and the gate contacts 175 and 275 may include, for example, at least one of metal, conductive metal nitride, conductive metal carbide, conductive metal oxide, a conductive metal carbonitride, and a two-dimensional (2D) material. The contact silicide films 155, 255 and 355 may include a metal silicide material.

A first contact connecting via 180 may be disposed between the first sub-element isolation structure 160_1 and the second sub-element isolation structure 160_2. The first contact connecting via 180 may connect the first back wiring line 50 and the first source/drain contact 170. The first contact connecting via 180 may connect the first back wiring line 50 and the second source/drain contact 270.

The first contact connecting via 180 is in contact with the first back wiring line 50. In other words, the first contact connecting via 180 is electrically connected to the first back wiring line 50 without another conductive pattern.

In an embodiment, the first contact connecting via 180 does not overlap the first source/drain contact 170 in the second direction D2. In an embodiment, the first contact connecting via 180 does not overlap the second source/drain contact 270 in the second direction D2. The first contact connecting via 180 may be spaced apart from the first source/drain contact 170 in the first direction D1. The first contact connecting via 180 may be spaced apart from the second source/drain contact 270 in the first direction D1.

A second contact connecting via 280 may be disposed between the first sub-element isolation structure 160_1 and the second sub-element isolation structure 160_2. The second contact connecting via 280 may connect the second back wiring line 60 and the third source/drain contact 370. The second contact connecting via 280 may connect the second back wiring line 60 and the fourth source/drain contact 470.

The second contact connecting via 280 may be connected to the second back wiring line 60. The second contact connecting via 280 is in contact with the second back wiring line 60.

In an embodiment, the second contact connecting via 280 does not overlap the third source/drain contact 370 in the second direction D2. In an embodiment, the second contact connecting via 280 does not overlap the fourth source/drain contact 470 in the second direction D2. The second contact connecting via 280 may be spaced apart from the third source/drain contact 370 in the first direction D1. The second contact connecting via 280 may be spaced apart from the fourth source/drain contact 470 in the first direction D1.

Figure 7:
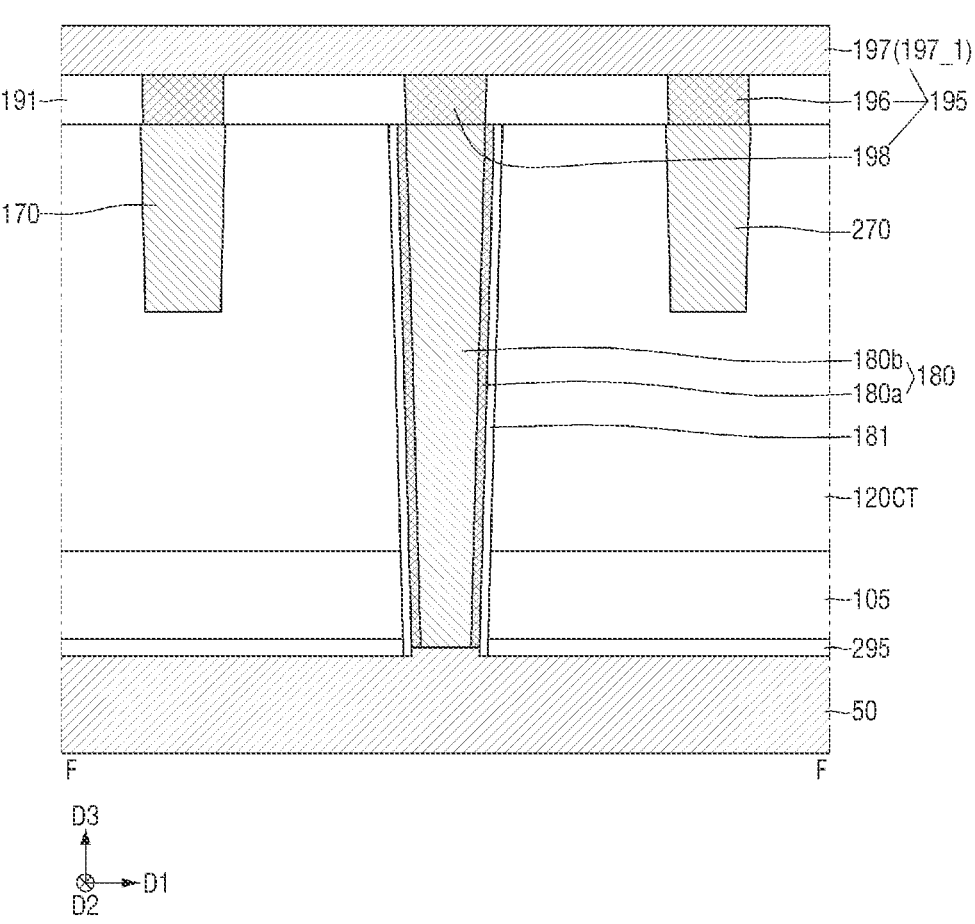

A shape in which the second contact connecting via 280 is connected to the third source/drain contact 370 and the fourth source/drain contact 470 may be similar to that of FIG. 7.

In an embodiment, the first contact connecting via 180 penetrates the source/drain etching stop film 156 and the field insulating film 105, and may be connected to the first back wiring line 50. In an embodiment, the second contact connecting via 280 penetrates the source/drain etching stop film 156 and the field insulating film 105, and may be connected to the second back wiring line 60. The first contact connecting via 180 may be spaced apart from the second contact connecting via 280 in the second direction D2. The first contact connecting via 180 and the second contact connecting via 280 may be arranged in the second direction D2.

Figure 6:
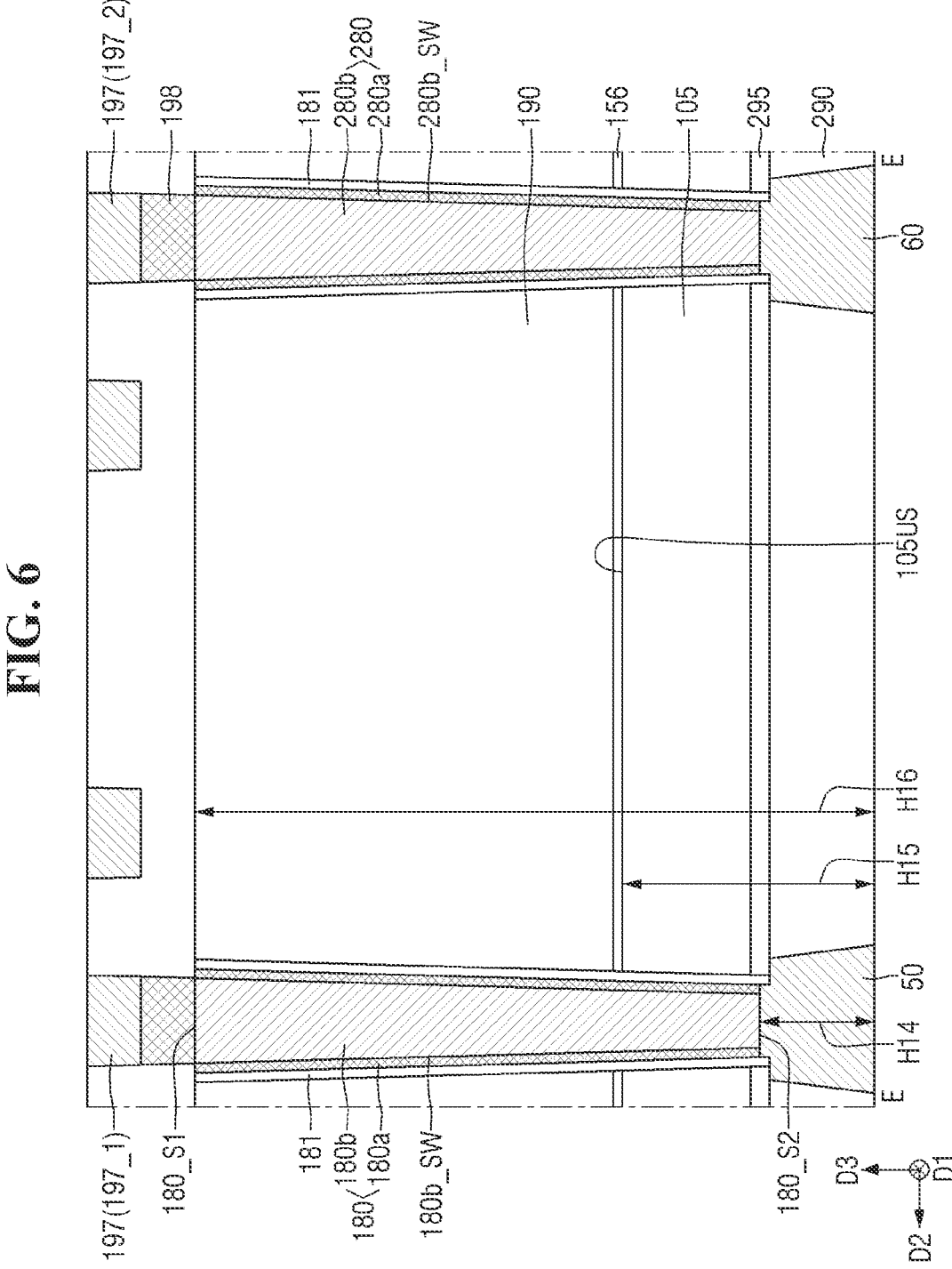

As shown in FIG. 7, a width of the first contact connecting via 180 in the first direction D1 may increase, as it goes away from the first back wiring line 50. As shown in FIG. 6, a width of the first contact connecting via 180 in the second direction D2 may increase, as it goes away from the first back wiring line 50. The description regarding the width of the sixth contact connecting via 680 may be the same or substantially the same as the description regarding the width of the fifth contact connecting via 580.

The following description will focus on the first contact connecting via 180. The description regarding the second contact connecting via 280 may be the same or substantially the same as the description regarding the first contact connecting via 180.

As shown in FIG. 6, the first contact connecting via 180 may include a first surface 180_S1 and a second surface 180_S2 that are opposite to each other in the third direction D3. The first surface 180_S1 of the first contact connecting via 180 may be connected to the first source/drain contact 170 and the second source/drain contact 270. The second surface 180_S2 of the first contact connecting via 180 may be connected to the first back wiring line 50. The second surface 180_S2 of the first contact connecting via 180 is in contact with the first back wiring line 50.

For example, a height H13 (see FIG. 4) from the second surface 50_S2 of the first back wiring line 50 to the upper surface of the first source/drain contact 170 may be the same as a height H16 (see FIG. 6) from the second surface 50_S2 of the first back wiring line 50 to the first surface 180_S1 of the first contact connecting via 180.

For example, as shown in FIG. 6, a height H15 from the second surface 50_S2 of the first back wiring line to the upper surface 105US of the field insulating film 150 is smaller than a height H16 from the second surface 50_S2 of the first back wiring line to the first surface 180_S1 of the first contact connecting via 180. In an embodiment, a height H12 (see FIG. 4) from the second surface 50_S2 of the first back wiring line 50 to the first surface BP1_US of the first lower pattern is smaller than the height H16 (see FIG. 6) from the second surface 50_S2 of the first back wiring line 50 to the first surface 180_S1 of the first contact connecting via 180. The first surface 180_S1 of the first contact connecting via 180 may protrude in the third direction D3 from the first surface BP1_US of the first lower pattern BP1 and the upper surface 105US of the field insulating film 105.

As shown in FIG. 6, the height H15 from the second surface 50_S2 of the first back wiring line 50 to the upper surface 105US of the field insulating film 105 is greater than the height H14 from the second surface 50_S2 of the first back wiring line 50 to the second surface 180_S2 of the first contact connecting via 180. In an embodiment, the height H12 (see FIG. 4) from the second surface 50_S2 of the first back wiring line 50 to the first surface BP1_US of the first lower pattern BP1 is greater than the height H14 (see FIG. 6) from the second surface 50_S2 of the first back wiring line 50 to the second surface 180_S2 of the first contact connecting via 180. A part of the first contact connecting via 180 is surrounded by the field insulating film 105.

In an embodiment, the height H11 from the second surface 50_S2 of the first back wiring line 50 to the second surface BP1_BS of the first lower pattern BP1 is greater than the height H14 from the second surface 50_S2 of the first back wiring line to the second surface 180_S2 of the first contact connecting via. The second surface BP1_BS of the first lower pattern BP1 may be higher than the second surface 180_S2 of the first contact connecting via on the basis of the second surface 50_S2 of the first back wiring line. The height H11 from the second surface 50_S2 of the first back wiring line 50 to the second surface BP1_BS of the first lower pattern may be a height from the second surface 50_S2 of the first back wiring line 50 to the lowermost part of the first lower pattern BP1.

As shown in FIG. 6, a connecting via liner 181 may be disposed on the side walls of the first contact connecting via 180 and the side walls of the second contact connecting via 280. Unlike the shown example, in an embodiment, the connecting via liner 181 is not disposed on the side walls of the first contact connecting via 180 and the side walls of the second contact connecting via 280. For example, the connecting via liner 181 may be omitted in an alternate embodiment.

The first contact connecting via 180 may include a first contact connecting barrier film 180a and a first contact connecting plug 180b. The first contact connecting barrier film 180a may extend along the side wall 180b_SW of the first contact connecting plug 180b.

The second contact connecting via 280 may include a second contact connecting barrier film 280a and a second contact connecting plug 280b. The second contact connecting barrier film 280a may extend along the side wall 280b_SW of the second contact connecting plug 280b.

For example, the first contact connecting plug 180b is in contact with the first back wiring line 50. The second contact connecting plug 280b is in contact with the second back wiring line 60.

The first contact connecting via 180 will be described as an example. The first surface 180_S1 of the first contact connecting via and the second surface 180_S2 of the first contact connecting via 180 may be defined by the first contact connecting barrier film 180a and the first contact connecting plug 180b.

The first contact connecting barrier film 180a and the second contact connecting barrier film 280a may include, for example, at least one of metal, metal alloy, conductive metal nitride, conductive metal carbide, conductive metal oxide, conductive metal carbonitride, and a two-dimensional material. The first contact connecting plug 180b and the second contact connecting plug 280b may include one of metal and metal alloy.

For example, the first contact connecting plug 180b and the second contact connecting plug 280b may have a single conductive film structure. In other words, the first contact connecting plug 180b and the second contact connecting plug 280b may contain a conductive material, and may be formed of a single film.

Unlike the shown example, in an embodiment, the first contact connecting via 180 and the second contact connecting via 280 have a single conductive film structure. In such cases, the first contact connecting via 180 and the second contact connecting via 280 may include a contact connecting plug without a contact connecting barrier film. For example, the first contact connecting barrier film 180a may be omitted. The first contact connecting plug 180b may extend further in the second direction D2 to fill the space left by the omitted first contact connecting barrier film 180a.

The connecting via liner 181 may include, for example, at least one of silicon nitride (SiN), silicon oxynitride (SiON), silicon oxide (SiO$_2$), silicon oxycarbonitride (SiOCN), silicon boronitride (SiBN), silicon oxyboronitride (SiOBN), silicon oxycarbide (SiOC), and combinations thereof.

When the first contact connecting via 180 is directly connected to the first back wiring line 50 having a line shape, the resistance between the first back wiring line 50 and the first contact connecting via 180 may decrease. The performance and reliability of the semiconductor device can be increased, accordingly.

The second upper interlayer insulating film 191 may be disposed on the first upper interlayer insulating film 190, the first gate structure GS1, the second gate structure GS2, the source/drain contacts 170, 270, 370 and 470, and the contact connecting vias 180 and 280. The second upper interlayer insulating film 191 may include, for example, at least one of silicon oxide, silicon nitride, silicon oxynitride, and a low dielectric constant material.

As shown in FIG. 7, the front wiring structure 195 may be disposed inside the second upper interlayer insulating film 191. The front wiring structure 195 may include a front wiring via 196, a front wiring line 197, and a wiring connecting via 198. The wiring connecting via 198 may connect the front wiring line 197 and the contact connecting vias 180 and 280.

The front wiring structure 195 may be connected to the source/drain contacts 170, 270, 370 and 470, the connecting source/drain contacts 172 and 272, and the gate contacts 175 and 275. The front wiring structure 195 may be connected to the contact connecting vias 180 and 280.

As shown in FIG. 6, the front wiring line 197 may include a first front wiring line 197_1 and a second front wiring line 197_2. The first front wiring line 197_1 and the second front wiring line 197_2 may each extend long in the first direction D1.

The front wiring line 197 may be disposed on the first element isolation structure 160. For example, the front wiring line 197 may be disposed on the first sub-element isolation structure 160_1 and the second sub-element isolation structure 160_2.

The first front wiring line 197_1 may connect the first source/drain contact 170 and the first contact connecting via 180. The first source/drain contact 170 may be disposed between the first source/drain pattern 150 and the first front wiring line 197_1. The first front wiring line 197_1 may connect the second source/drain contact 270 and the first contact connecting via 180. The first surface 180_S1 of the first contact connecting via 180 is connected to the first front wiring line 197_1. For example, the first front wiring line 197_1 may be connected to the first contact connecting via 180 through the wiring connecting via 198.

The second front wiring line 197_2 may connect the third source/drain contact 370 and the second contact connecting via 280. The third source/drain contact 370 may be disposed between the third source/drain pattern 350 and the second front wiring line 197_2. The second front wiring line 197_2 may connect the fourth source/drain contact 470 and the second contact connecting via 280. For example, the second front wiring line 197_2 may be connected to the second contact connecting via 280 through the wiring connecting via 198.

The front wiring via 196, the front wiring line 197, and the wiring connecting via 198 may each include, for example, at least one of metal, metal alloy, conductive metal nitride, conductive metal carbide, conductive metal oxide, conductive metal carbonitride, and a two-dimensional material.

Although the front wiring via 196, the front wiring line 197, and the wiring connecting via 198 are each shown as being a single conductive film structure, embodiments of the disclosure are not limited thereto. Unlike the shown example, in an embodiment, at least one of the front wiring via 196, the front wiring line 197, and the wiring connecting via 198 have multiple conductive film structures. As another example, the front wiring structure 195 may have an integral structure in which there is no boundary division between the front wiring vias 196 and the front wiring lines 197, and between the wiring connecting via 198 and the front wiring line 197. For example, a single layer may be used to generate the front wiring via 196, the front wiring line 197, and the wiring connecting via 198.

Figure 8:
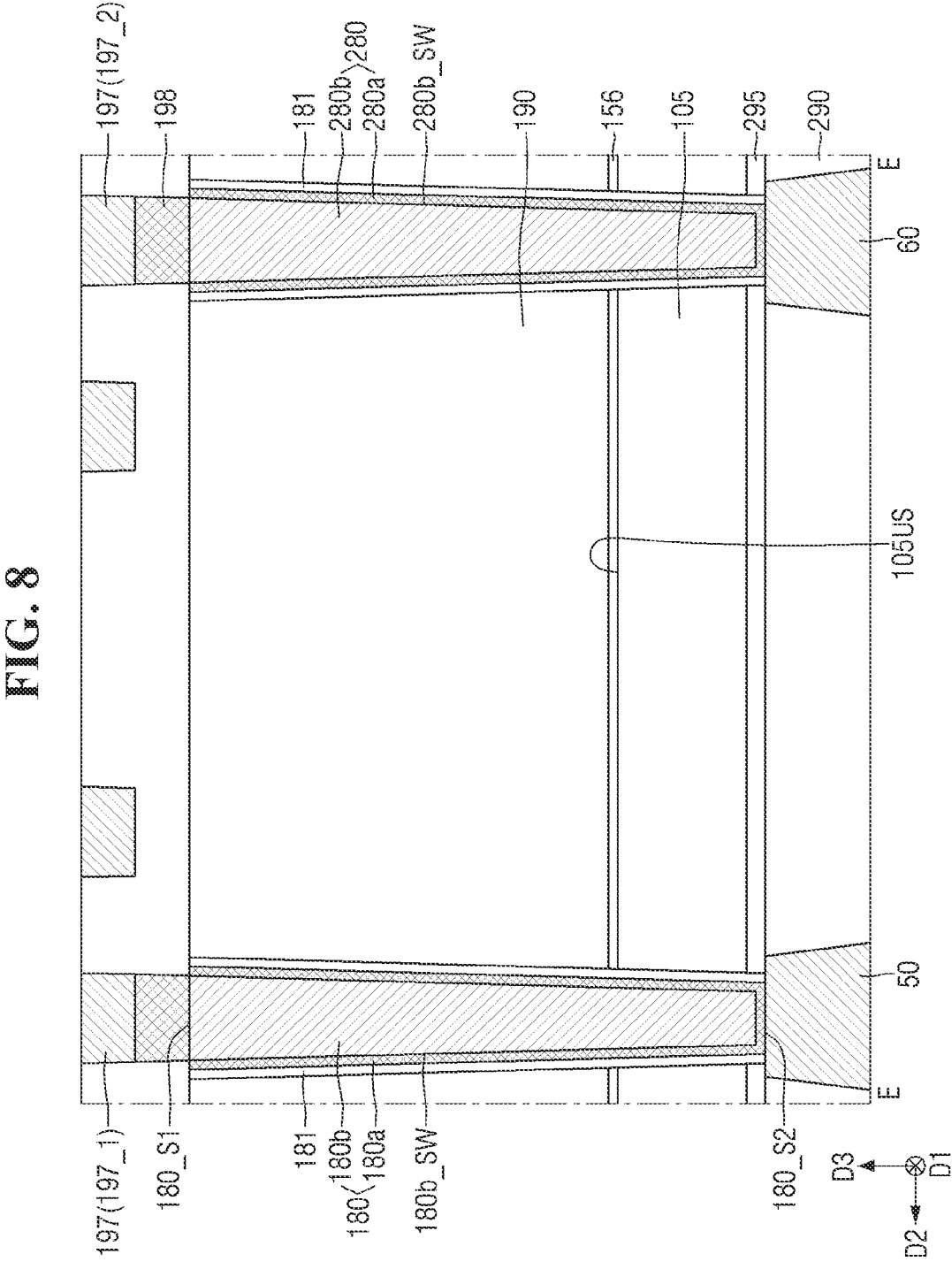
FIGS. 8 and 9 are diagrams for explaining a semiconductor device according to some embodiments.
Figure 9:
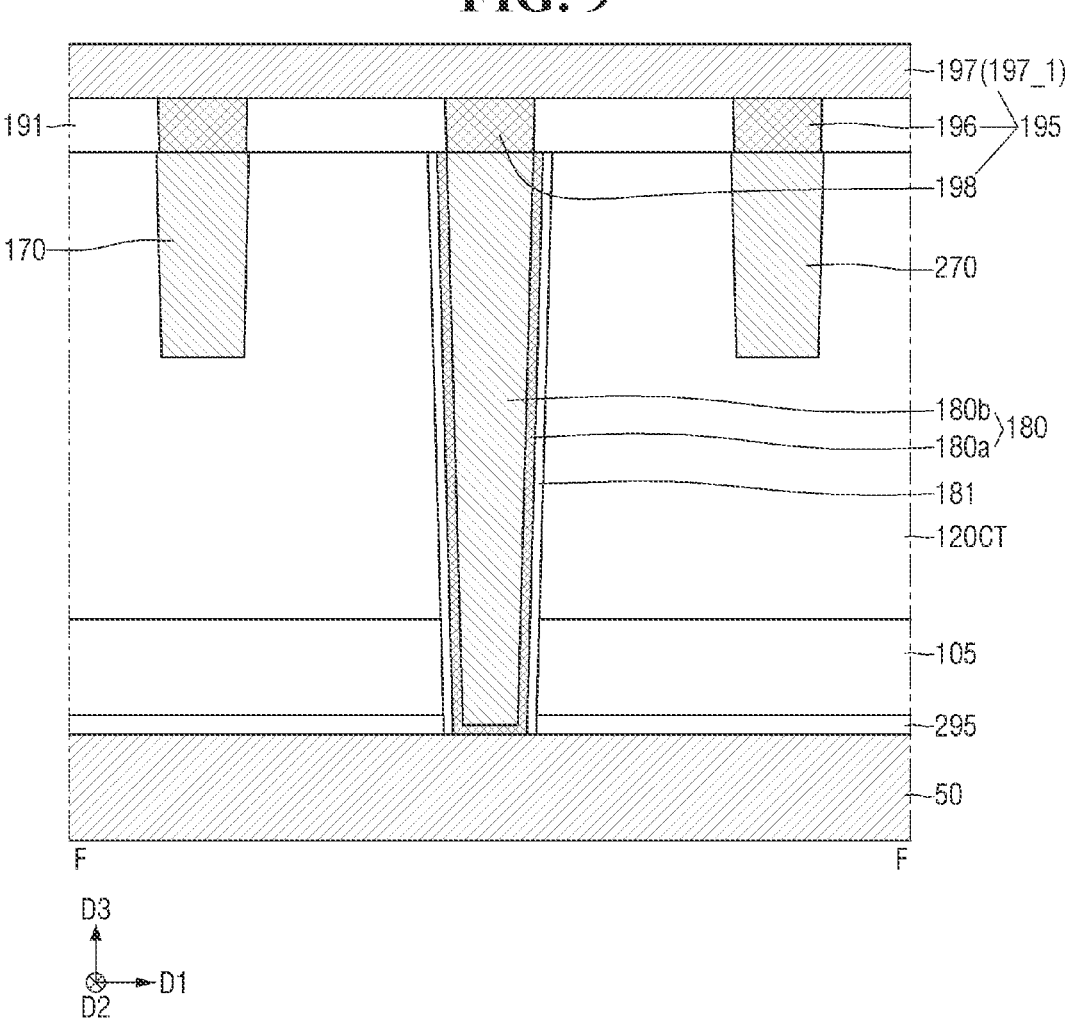
Figure 10:
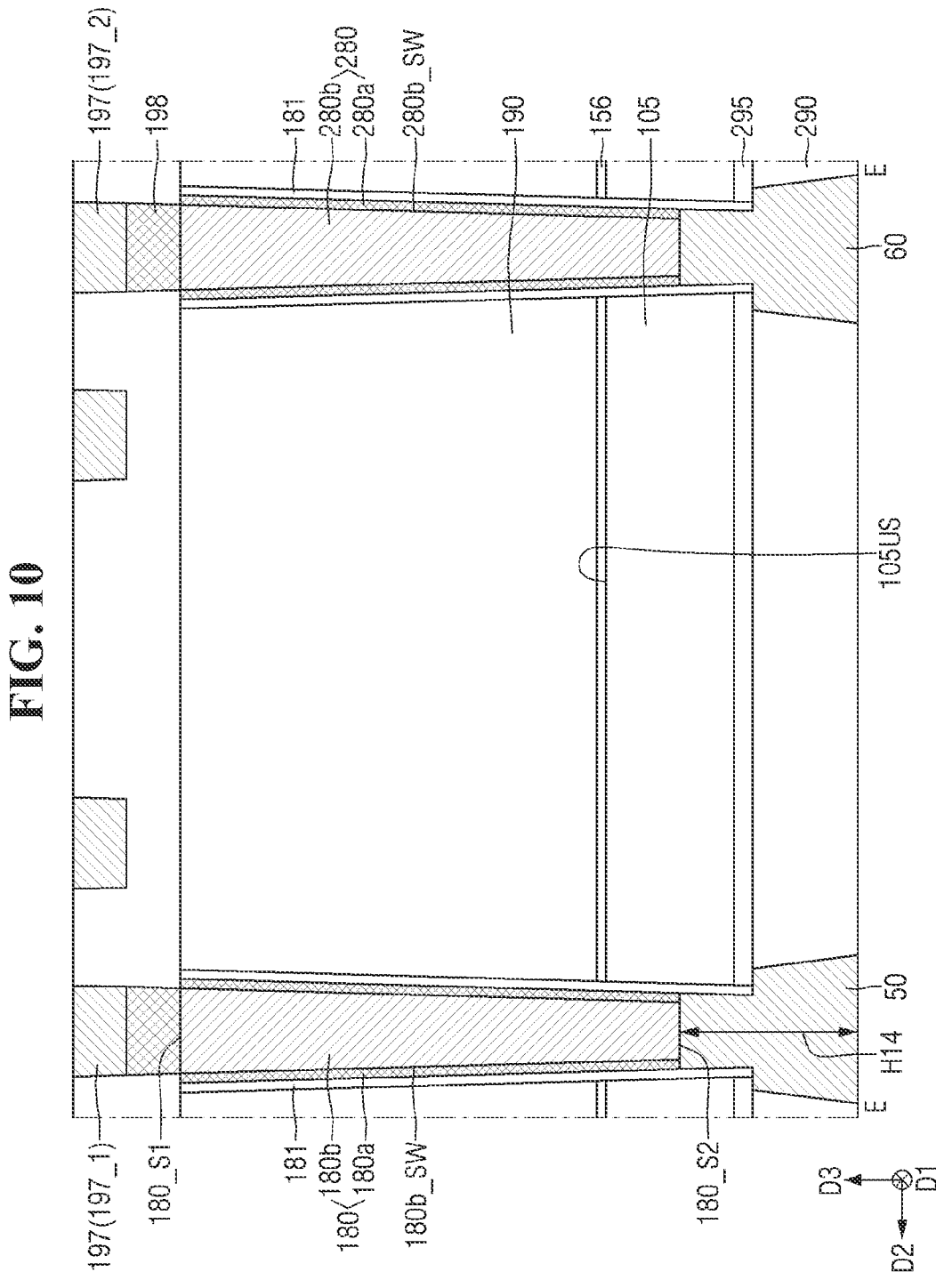
FIGS. 10 and 11 are diagrams for explaining a semiconductor device according to some embodiments.
Figure 11:
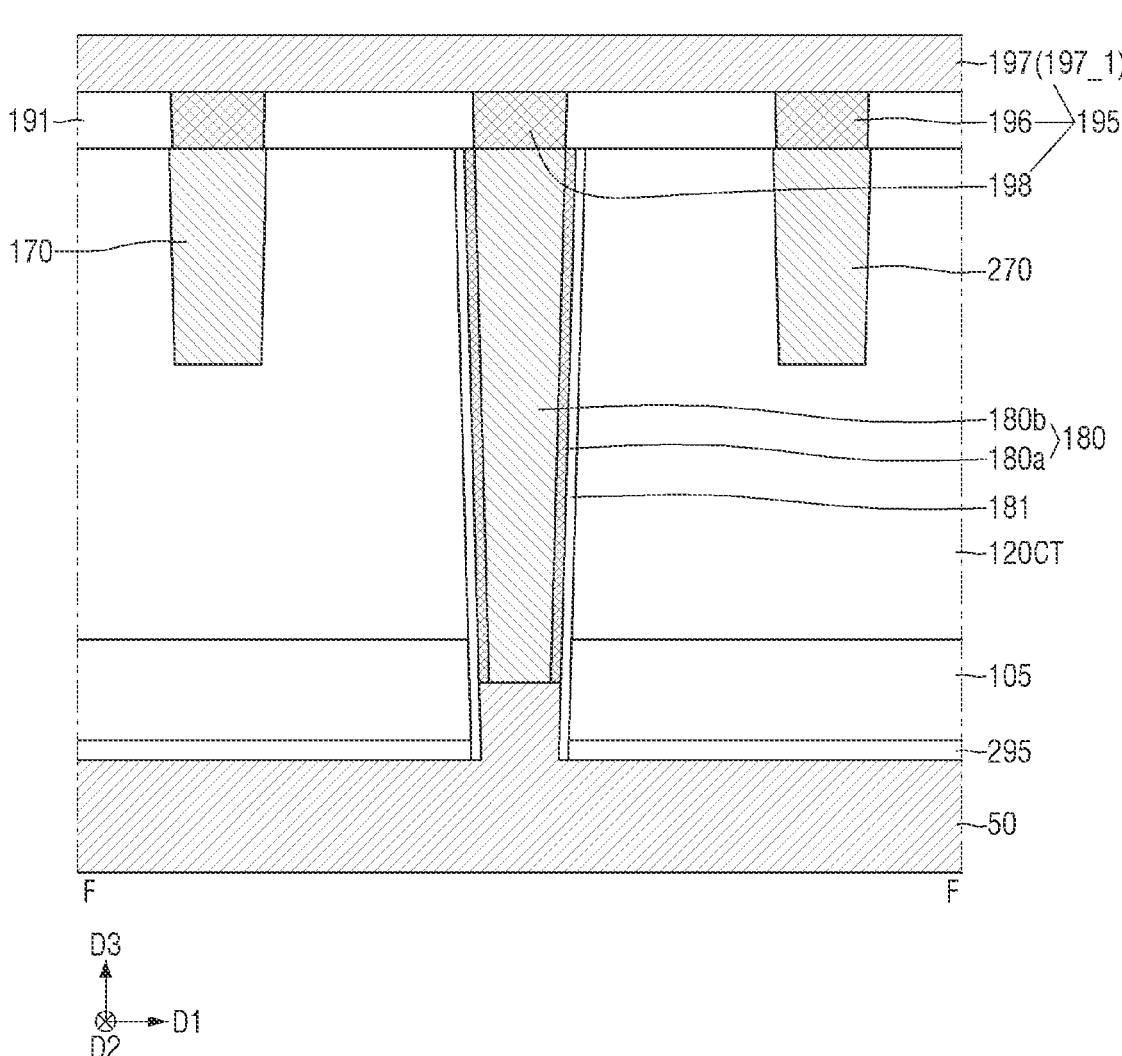
Figure 12:
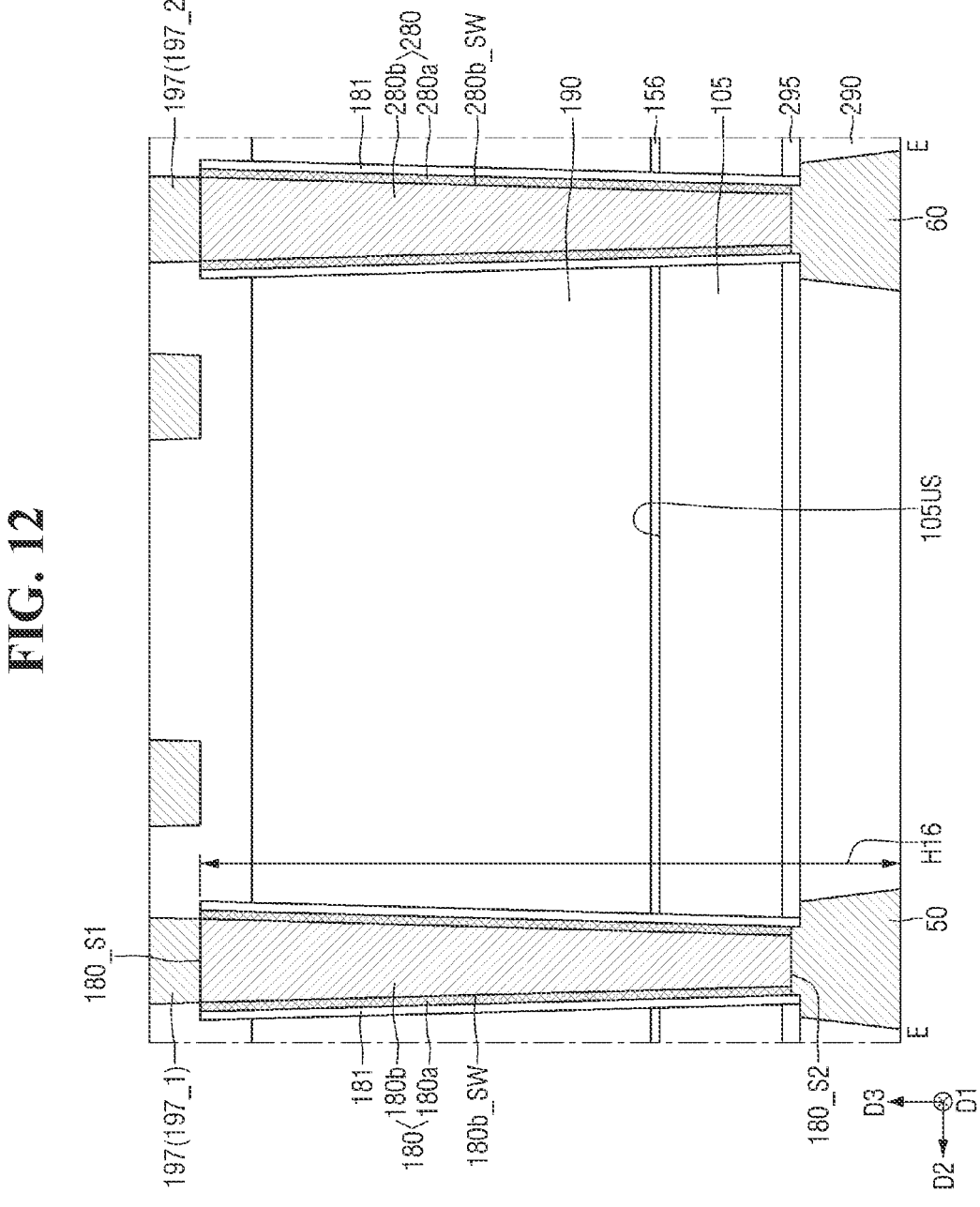
FIGS. 12 and 13 are diagrams for explaining a semiconductor device according to some embodiments.
Figure 13:
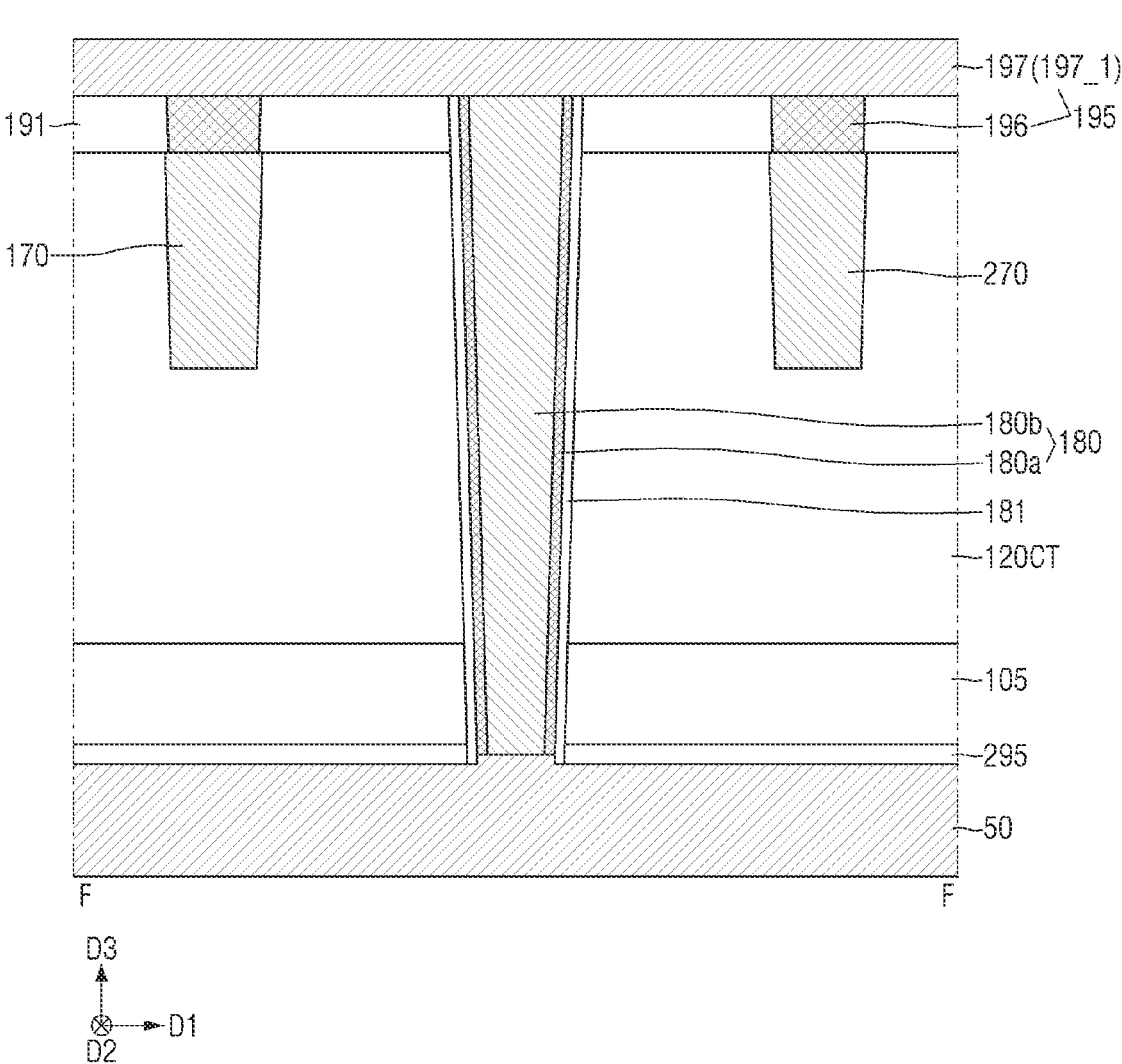

FIGS. 8 and 9 are diagrams for explaining a semiconductor device according to some embodiments. FIGS. 10 and 11 are diagrams for explaining a semiconductor device according to some embodiments. FIGS. 12 and 13 are diagrams for explaining a semiconductor device according to some embodiments. For convenience of explanation, features that are different from those explained using FIGS. 1 to 7 will be mainly explained.

Referring to FIGS. 8 and 9, in the semiconductor device according to some embodiments, the first contact connecting barrier film 180a is disposed between the first contact connecting plug 180b and the first back wiring line 50.

In this embodiment, the first contact connecting plug 180b is not in contact with the first back wiring line 50. The second surface 180_S2 of the first contact connecting via 180 may be defined by the first contact connecting barrier film 180a. For example, the first contact connecting barrier film 180a may prevent the first contact connecting plug 180b from contacting the first back wiring line 50.

The second contact connecting barrier film 280a may be disposed between the second contact connecting plug 280b and the second back wiring line 60. In this embodiment, the second contact connecting plug 280b is not in contact with the second back wiring line 60. For example, the second contact connecting barrier film 280a may prevent the second contact connecting plug 180b from contacting the second back wiring line 60.

Referring to FIGS. 4, 10 and 11, in the semiconductor device according to some embodiments, the height H11 from the second surface 50_S2 of the first back wiring line to the second surface BP1_BS of the first lower pattern is smaller than the height H14 from the second surface 50_S2 of the first back wiring line to the second surface 180_S2 of the first contact connecting via 180.

On the basis of the second surface 50_S2 of the first back wiring line 50, the second surface BP1_BS of the first lower pattern BP1 may be lower than the second surface 180_S2 of the first contact connecting via 180.

Unlike the shown example, in an embodiment, the height H11 from the second surface 50_S2 of the first back wiring line 50 to the second surface BP1_BS of the first lower pattern BP1 is the same as the height H14 from the second surface 50_S2 of the first back wiring line to the second surface 180_S2 of the first contact connecting via 180.

Referring to FIGS. 4, 12 and 13, in the semiconductor device according to some embodiments, the first front wiring line 197_1 is directly connected to the first contact connecting via 180.

The first front wiring line 197_1 may be in contact with the first surface 180_S1 of the first contact connecting via 180. The first contact connecting via 180 may be connected to the first front wiring line 197_1 without the wiring connecting via 198. For example, the wiring connecting via 198 may be omitted.

In the embodiment of FIG. 12, the second front wiring line 197_2 may be directly connected to the second contact connecting via 280. The second contact connecting via 280 may be connected to the second front wiring line 197_2 without the wiring connecting via 198.

In an embodiment, the height H13 from the second surface 50_S2 of the first back wiring line 50 to the upper surface of the first source/drain contact 170 is smaller than the height H16 from the second surface 50_S2 of the first back wiring line 50 to the first surface 180_S1 of the first contact connecting via 180.

Figure 14:
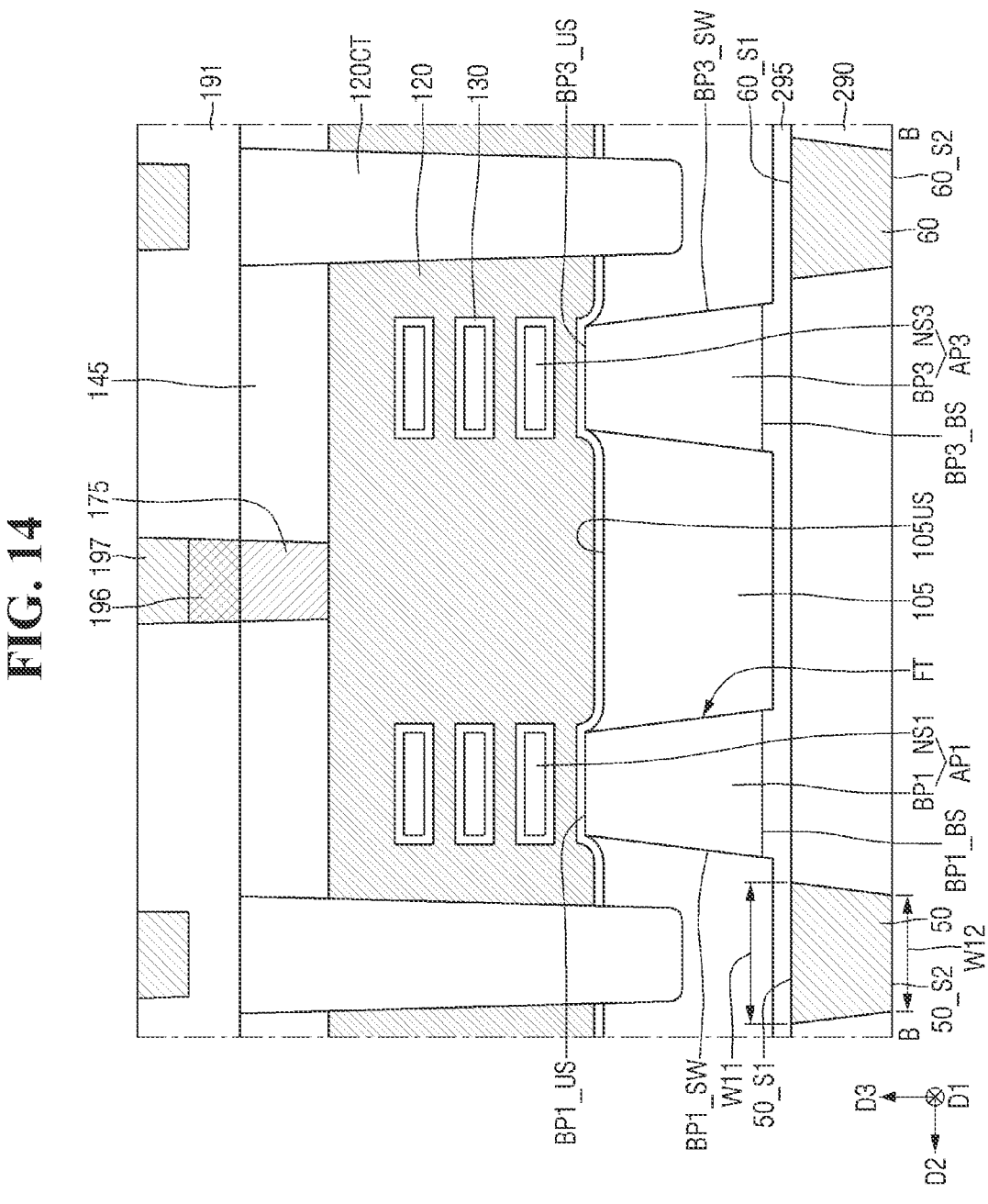
FIGS. 14 and 15 are diagrams for explaining a semiconductor device according to some embodiments, respectively.
Figure 15:
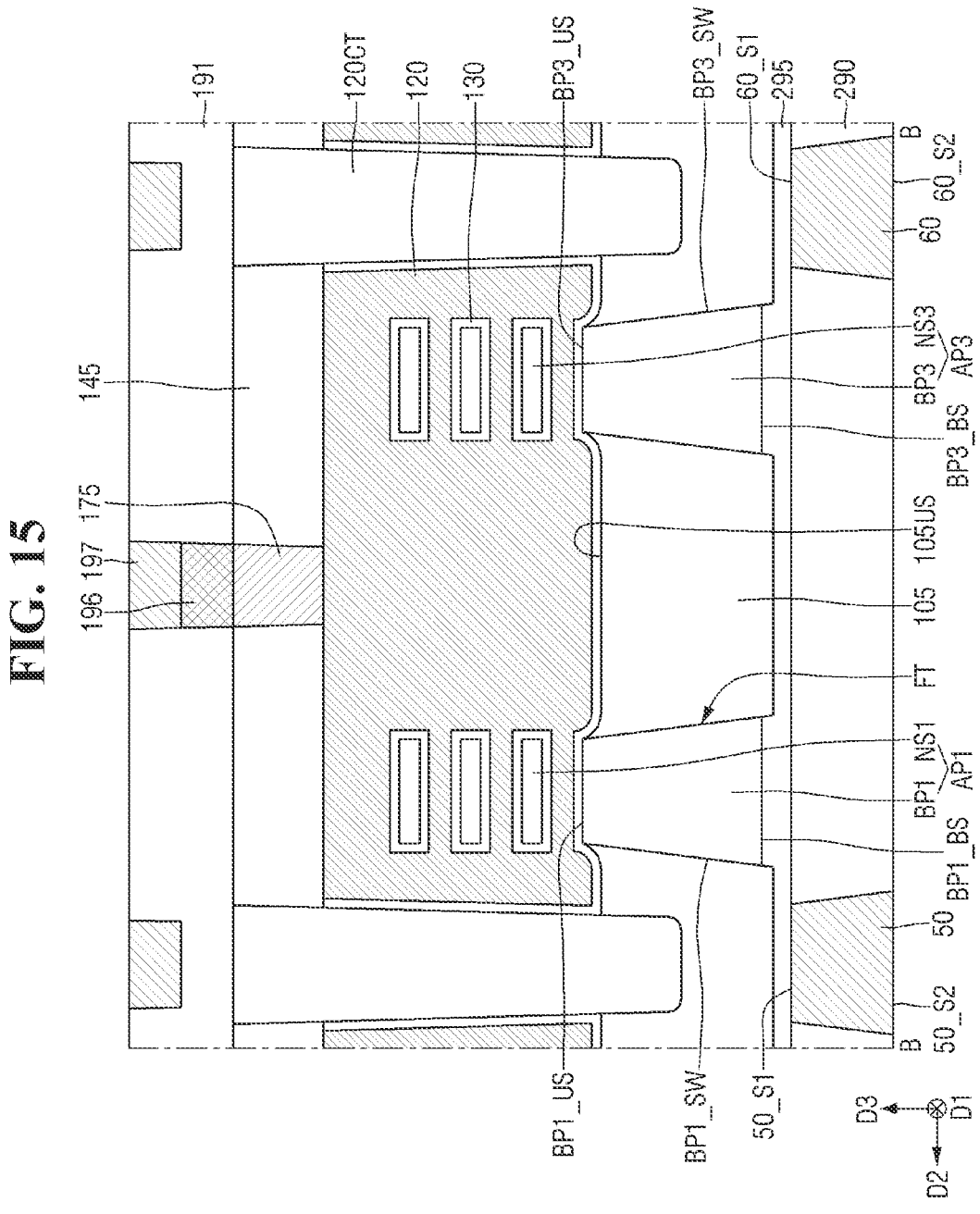
Figure 16:
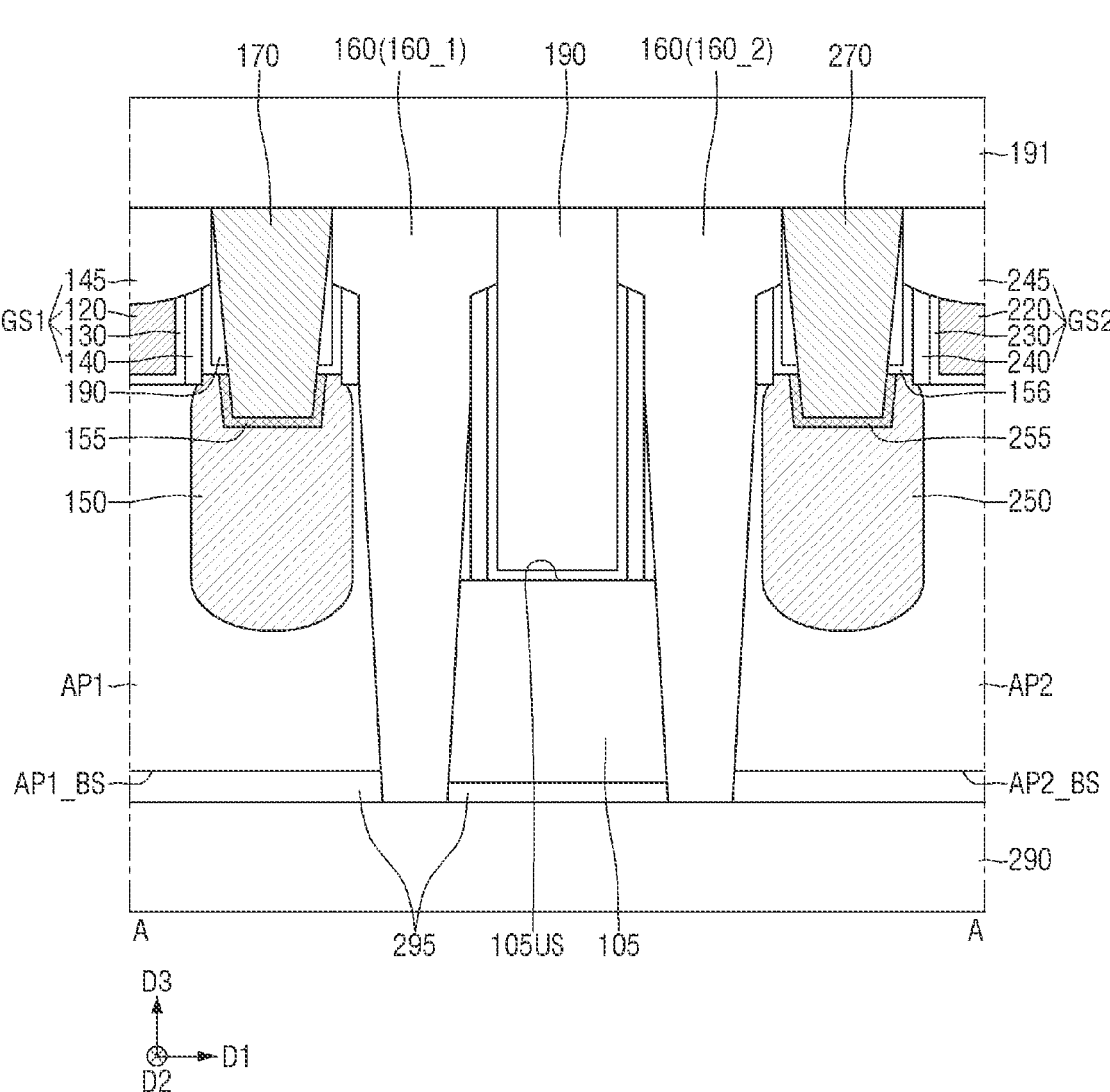
Figure 17:
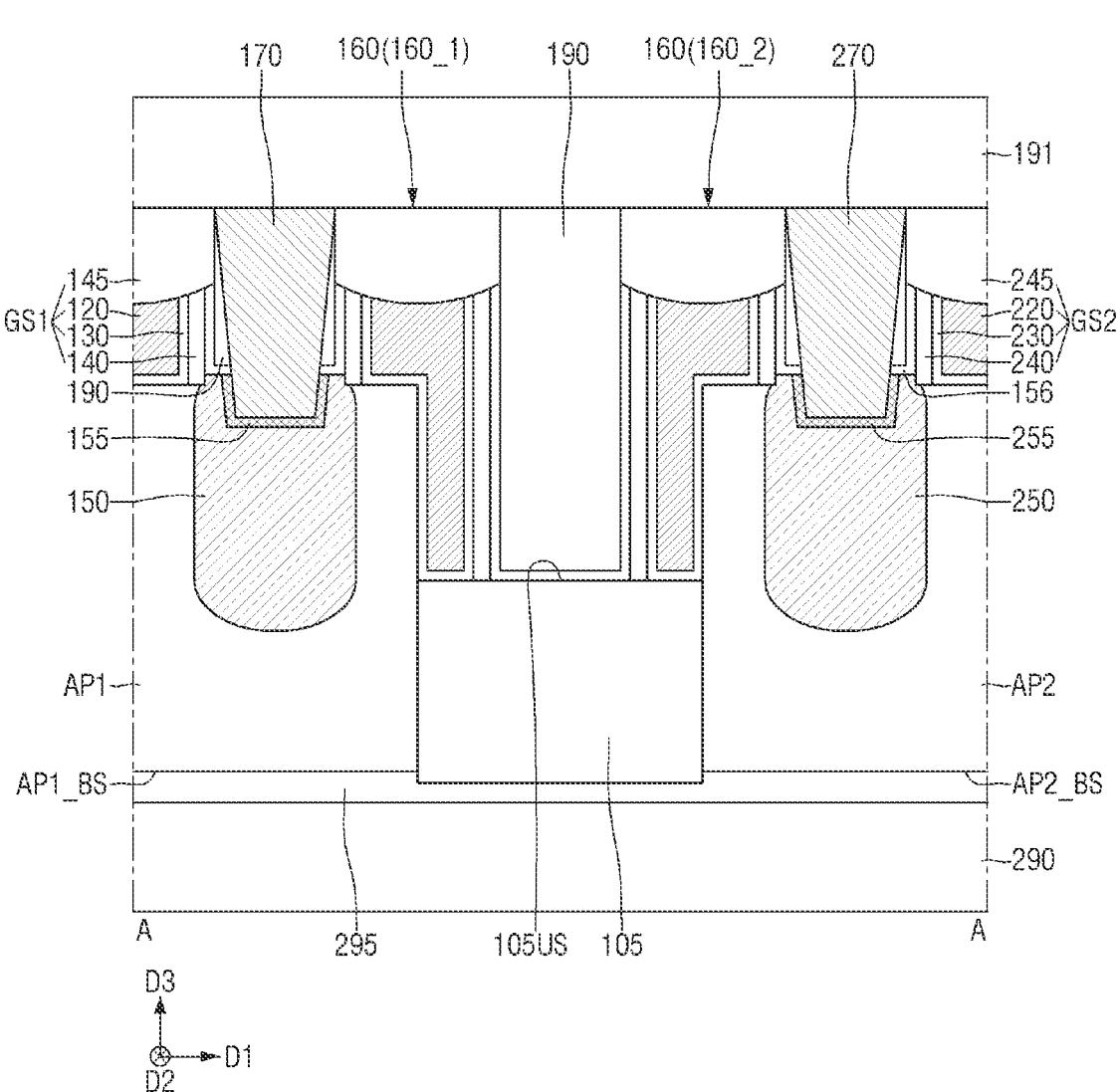

FIGS. 14 and 15 are diagrams for explaining a semiconductor device according to some embodiments, respectively. FIGS. 16 to 18 are diagrams for explaining a semiconductor device according to some embodiments. For convenience of explanation, features that are different from those explained using FIGS. 1 to 7 will be mainly explained.

Referring to FIG. 14, in the semiconductor device according to some embodiments, a width W11 of the first surface 50_S1 of the first back wiring line in the second direction D2 is greater than a width W12 of the second surface 50_S2 of the first back wiring line 50 in the second direction D2.

For example, the first back wiring line 50 and the second back wiring line 60 may each be formed, using an etching process. A conductive film may be formed on the insertion insulating film 295. The conductive film on the insertion insulating film 295 may be patterned to form the first back wiring line 50 and the second back wiring line 60. For example, portions of the conductive film may be removed to form the first back wiring line 50 and the second back wiring line 60. Subsequently, a back interlayer insulating film 290 that covers the side walls of the first back wiring line 50 and the side walls of the second back wiring lines 60 may be formed.

Referring to FIG. 15, in the semiconductor device according to some embodiments, the first gate insulating film 130 may be disposed between the first gate electrode 120 and the gate isolation structure 120CT.

The first gate insulating film 130 may extend along the short side wall of the first gate electrode 120 in the third direction D3. For example, the first gate insulating film 130 may extend between the side walls of the first gate electrode 120 that are shorter in the third direction D3.

Referring to FIGS. 16 to 18, in the semiconductor device according to some embodiments, the active patterns AP1, AP2, AP3 and AP4 each do not include a sheet pattern.

In an embodiment, the active patterns AP1, AP2, AP3 and AP4 are fin-shaped patterns protruding above the upper surface 105US of the field insulating film 105. In FIG. 18, the field insulating film 105 may cover a part of the side wall AP1_SW of the first active pattern AP1 and a part of the side wall AP3_SW of the third active pattern AP3. The field insulating film 105 may also cover a part of the side walls of the second active pattern AP2 and a part of the side walls of the fourth active pattern AP4.

Unlike the embodiment of FIG. 2, the first gate structure GS1 does not include the first inner gate structure INT_GS1. Unlike the embodiment of FIG. 2, the second gate structure GS2 does not include the second inner gate structure INT_GS2.

In FIG. 16, the first sub-element isolation structure 160_1 and the second sub-element isolation structure 160_2 may extend to the lower surface AP1_BS of the first active pattern AP1 and the lower surface AP2_BS of the second active pattern AP2.

In FIG. 17, the first sub-element isolation structure 160_1 and the second sub-element isolation structure 160_2 may be disposed on the upper surface 105US of the field insulating film 105. The first sub-element isolation structure 160_1 may wrap or surround an end of the first active pattern AP1. The second sub-element isolation structure 160_2 may wrap or surround the end of the second active pattern AP2. The first sub-element isolation structure 160_1 and second sub-element isolation structure 160_2 do not extend to the lower surface AP1_BS of the first active pattern and the lower surface AP2_BS of the second active pattern. For example, the first sub-element isolation structure 160_1 and the second sub-element isolation structure 160_2 may have the same stacked film structure as those of the first gate structure GS1 and the second gate structure GS2.

Figure 19:
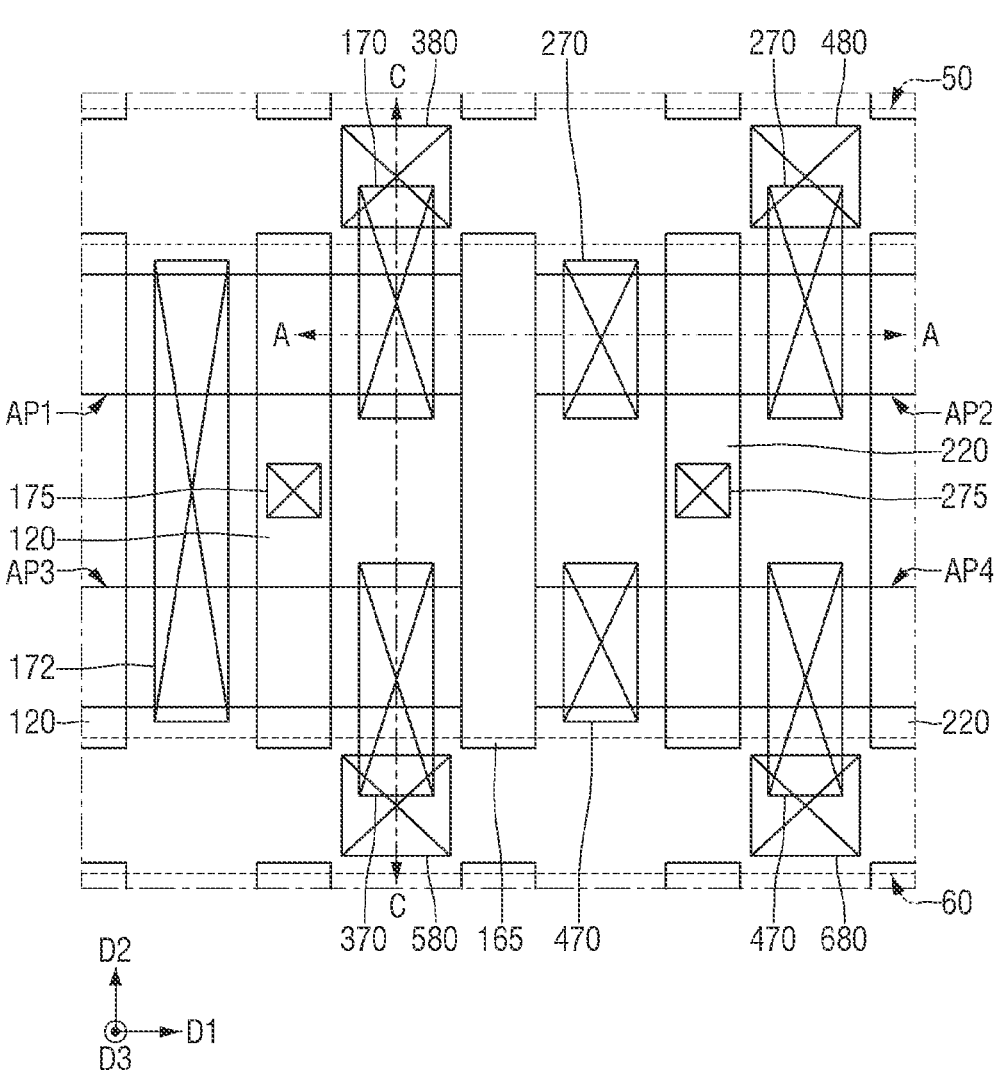
FIG. 19 is a layout diagram for explaining a semiconductor device according to some embodiments.
Figure 20:
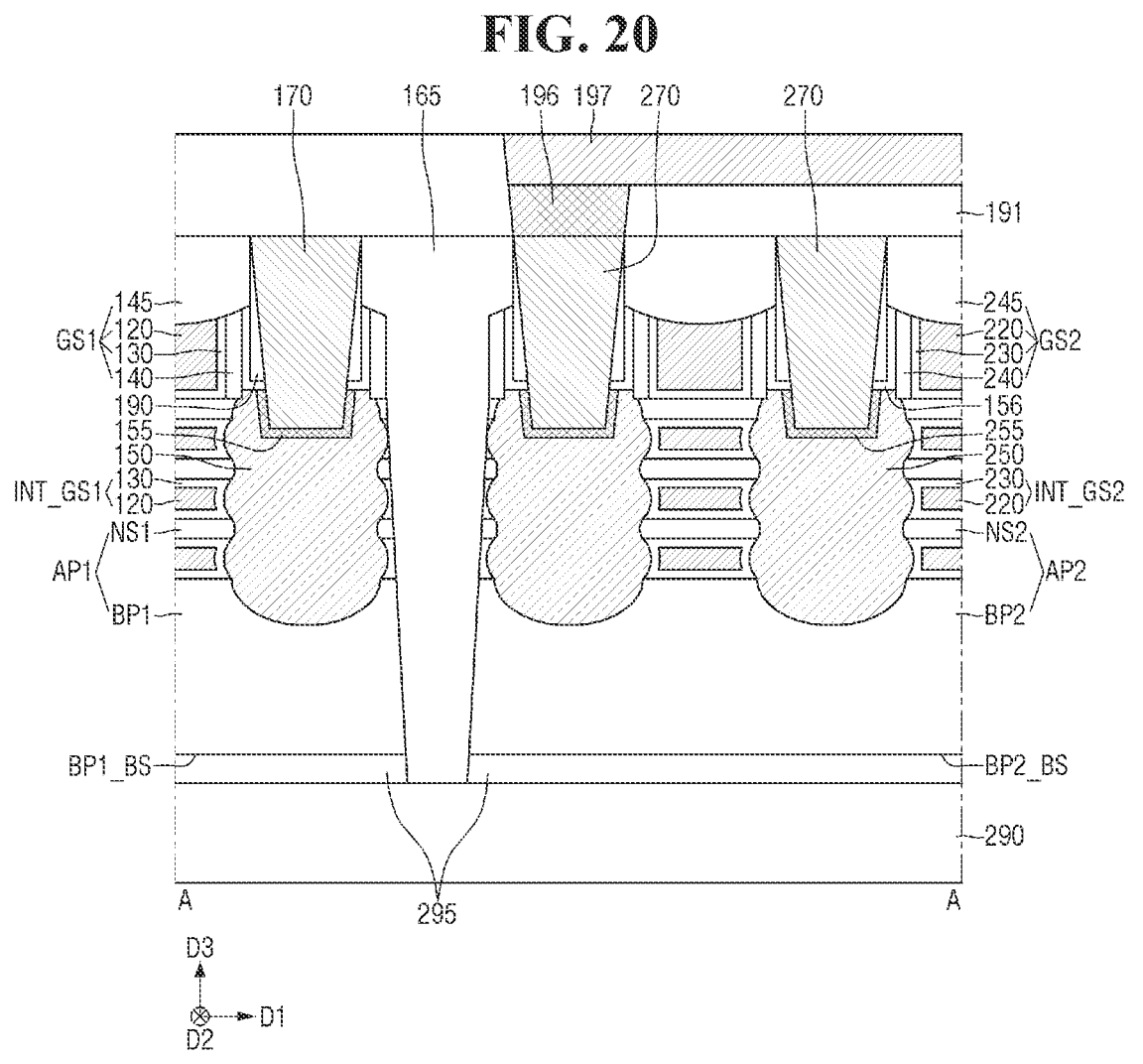
Figure 21:
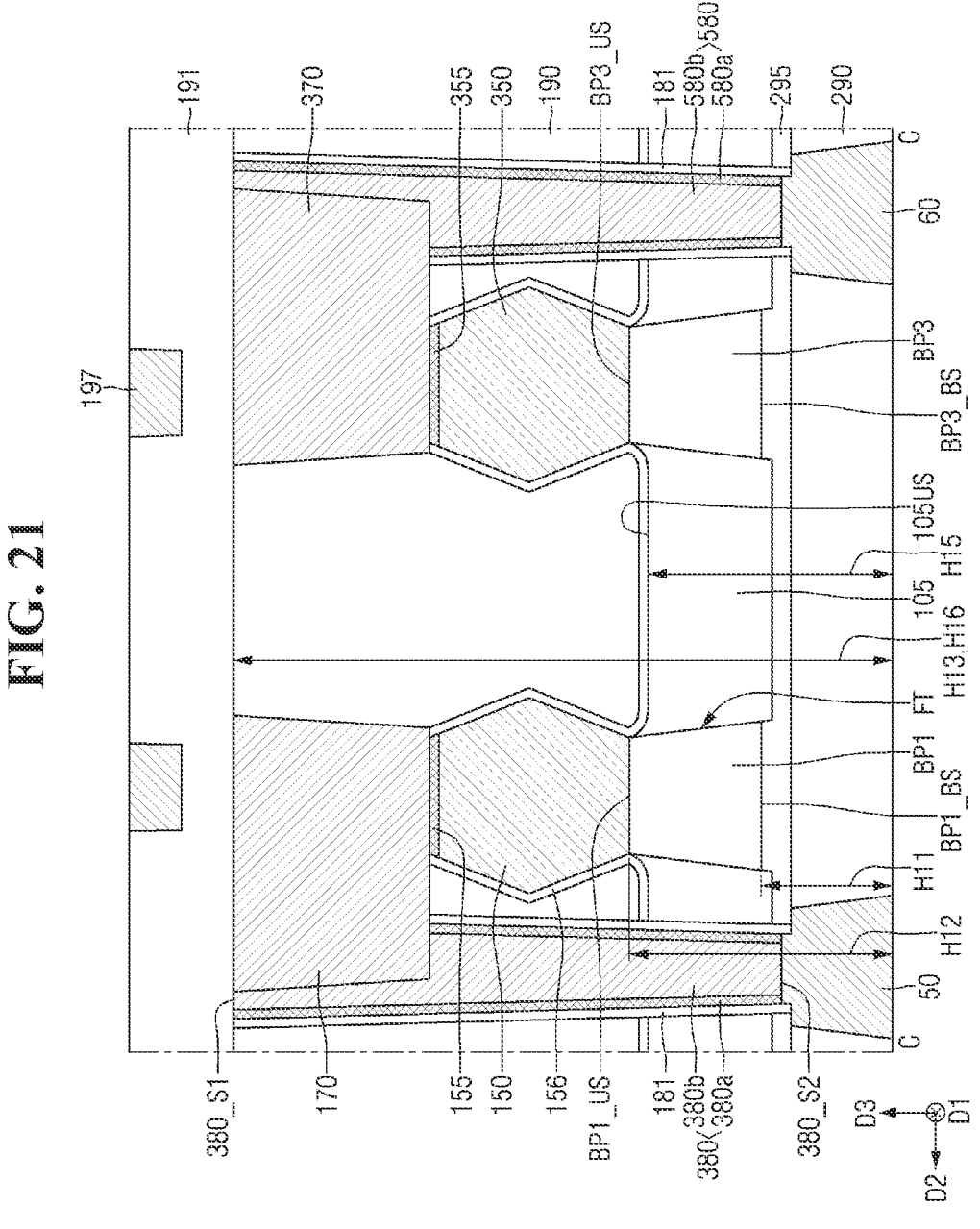

FIG. 19 is a layout diagram for explaining a semiconductor device according to some embodiments. FIGS. 20 and 21 are cross-sectional views taken along lines A-A and C-C of FIG. 19. For convenience of explanation, features that are different from those explained using FIGS. 1 to 7 will be mainly explained.

For reference, a cross-sectional view in which a portion, in which the fourth contact connecting via 480 and the sixth contact connecting via 680 are disposed, is cut in the second direction D2 may be substantially the same as that of FIG. 21.

Referring to FIGS. 19 to 21, the semiconductor device according to some embodiments may include third to sixth contact connecting vias 380, 480, 580, and 680.

The second element isolation structure 165 may be disposed on the back interlayer insulating film 290, the first back wiring line 50 and the second back wiring line 60. The second element isolation structure 165 may be disposed on the first surface (50_S1 of FIG. 3) of the first back wiring line and the first surface (60_S1 of FIG. 3) of the second back wiring line.

The second element isolation structure 165 may be disposed between the first active pattern AP1 and the second active pattern AP2. The second element isolation structure 165 may be disposed between the third active pattern AP3 and the fourth active pattern AP4. The second element isolation structure 165 may be disposed between the first source/drain pattern 150 and the second source/drain pattern 250. The second element isolation structure 165 may be disposed between the third source/drain pattern 350 and the fourth source/drain pattern.

The second element isolation structure 165 may isolate the first lower pattern BP1 and the second lower pattern BP2. The second element isolation structure 165 may isolate the third lower pattern BP3 and the fourth lower pattern. For example, the second element isolation structure 165 may prevent the first lower pattern BP1 from being electrically connected to the second lower pattern BP2 and prevent the third lower pattern BP3 from being electrically connected to the fourth lower pattern. The first lower pattern BP1 and the second lower pattern BP2 may each protrude from the second element isolation structure 165 in the first direction D1. The third lower pattern BP3 and the fourth lower pattern may each protrude from the second element isolation structure 165 in the first direction D1.

A third contact connecting via 380 may be disposed between the first source/drain contact 170 and the first back wiring line 50. The third contact connecting via 380 may connect the first source/drain contact 170 and the first back wiring line 50. The third contact connecting via 380 is in contact with the first back wiring line 50. The third contact connecting via 380 overlaps the first source/drain contact 170 in the second direction D2.

A fifth contact connecting via 580 may be disposed between the third source/drain contact 370 and the second back wiring line 60. The fifth contact connecting via 580 may connect the third source/drain contact 370 and the second back wiring line 60. The fifth contact connecting via 580 is in contact with the second back wiring line 60. The fifth contact connecting via 580 overlaps the third source/drain contact 370 in the second direction D2.

A fourth contact connecting via 480 may connect the second source/drain contact 270 and the first back wiring line 50. The third contact connecting via 380 overlaps the first source/drain contact 170 in the second direction D2.

A sixth contact connecting via 680 may connect the fourth source/drain contact 470 and the second back wiring line 60. The sixth contact connecting via 680 overlaps the fourth source/drain contact 470 in the second direction D2.

The fourth contact connecting via 480 may be in contact with the first back wiring line 50. The sixth contact connecting via 680 is in contact with the second back wiring line 60.

The third contact connecting via 380 and the fourth contact connecting via 480 penetrate the source/drain etching stop film 156 and the field insulating film 105, and may be connected to the first back wiring line 50. The third contact connecting via 380 may be spaced apart from the fourth contact connecting via 480 in the first direction D1. The third contact connecting via 380 and the fourth contact connecting via 480 may be arranged in the first direction D1.

The fifth contact connecting via 580 and the sixth contact connecting via 680 penetrate the source/drain etching stop film 156 and the field insulating film 105, and may be connected to the second back wiring line 60. The fourth contact connecting via 480 may be spaced apart from the sixth contact connecting via 680 in the first direction D1. The fourth contact connecting via 480 and the sixth contact connecting via 680 may be arranged in the first direction D1.

Although the first source/drain contact 170 connected to the third contact connecting via 380 is shown as being aligned with the third source/drain contact 370 connected to the fifth contact connecting via 580 in the second direction D2, this is only for convenience of explanation, and the embodiment is not limited thereto.

The third contact connecting via 380 will be described as an example. In a cross-sectional view such as FIG. 21, a part of the third contact connecting via 380 may overlap the first source/drain contact 170 in the third direction D3, and the rest of the third contact connecting via 380 does not overlap the first source/drain contact 170 in the third direction D3.

The third contact connecting via 380 may include a first surface 380_S1 and a second surface 380_S2 that are opposite to each other in the third direction D3. The first surface 380_S1 of the third contact connecting via 380 may be connected to the first source/drain contact 170. The second surface 380_S2 of the third contact connecting via 380 may be connected to the first back wiring line 50. The second surface 380_S2 of the third contact 380 connecting via is in contact with the first back wiring line 50.

For example, the height H13 from the second surface (50_S2 of FIG. 3) of the first back wiring line 50 to the upper surface of the first source/drain contact 170 may be the same as the height H16 from the second surface 50_S2 of the first back wiring line 50 to the first surface 380_S1 of the third contact connecting via 380.

For example, the height H15 from the second surface 50_S2 of the first back wiring line 50 to the upper surface 105US of the field insulating film 105 is smaller than the height H16 from the second surface 50_S2 of the first back wiring line to the first surface 380_S1 of the third contact connecting via. The height H12 from the second surface 50_S2 of the first back wiring line 50 to the first surface BP1_US of the first lower pattern BP1 is smaller than the height H16 from the second surface 50_S2 of the first back wiring line 50 to the first surface 380_S1 of the third contact connecting via 380.

The height H15 from the second surface 50_S2 of the first back wiring line 50 to the upper surface 105US of the field insulating film 105 is greater than the height H14 from the second surface 50_S2 of the first back wiring line 50 to the second surface 380_S2 of the third contact connecting via 380. The height H12 from the second surface 50_S2 of the first back wiring line 50 to the first surface BP1_US of the first lower pattern BP1 is greater than the height H14 from the second surface 50_S2 of the first back wiring line 50 to the second surface 380_S2 of the third contact connecting via 380.

A connecting via liner 181 may be disposed on the side walls of the third contact connecting via 380 and the side walls of the fifth contact connecting via 580. The connecting via liner 181 may be disposed on the side walls of the fourth contact connecting via 480 and the side walls of the sixth contact connecting via 680.

The third contact connecting via 380 may include a third contact connecting barrier film 380a and a third contact connecting plug 380b. The third contact connecting barrier film 380a may extend along side walls of the third contact connecting plug 380b.

The fifth contact connecting via 580 may include a fifth contact connecting barrier film 580a and a fifth contact connecting plug 580b. The fifth contact connecting barrier film 580a may extend along side walls of the fifth contact connecting plug 580b.

The fourth contact connecting via 480 may include a fourth contact connecting barrier film and a fourth contact connecting plug. A sixth contact connecting via 680 may include a sixth contact connecting barrier film and a sixth contact connecting plug.

The description for the third to sixth contact connecting vias 380, 480, 580 and 680 may be the same or substantially the same as the description for the first and second contact connecting vias (180 and 280 of FIG. 7).

The front wiring structure 195 may include a front wiring via 196 and a front wiring line 197. The front wiring structure 195 does not include a wiring connecting via such as 198 of FIGS. 6 and 7.

The third to sixth contact connecting vias 380, 480, 580, and 680 are not connected to the first to fourth source/drain contacts 170, 270, 370, and 470 through the front wiring line 197.

Figure 22:
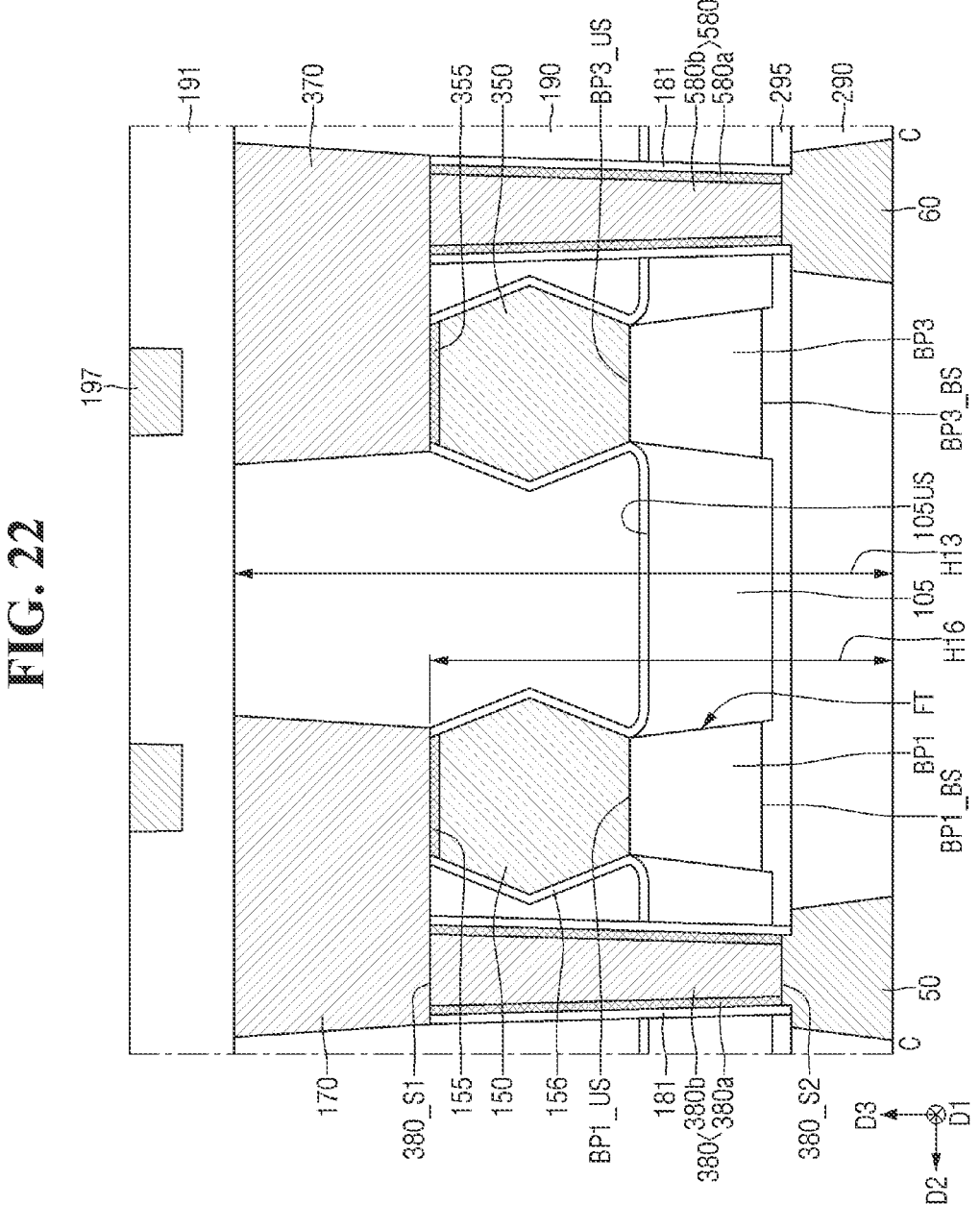
FIGS. 22 and 23 are diagrams for explaining the semiconductor device according to some embodiments, respectively.
Figure 23:
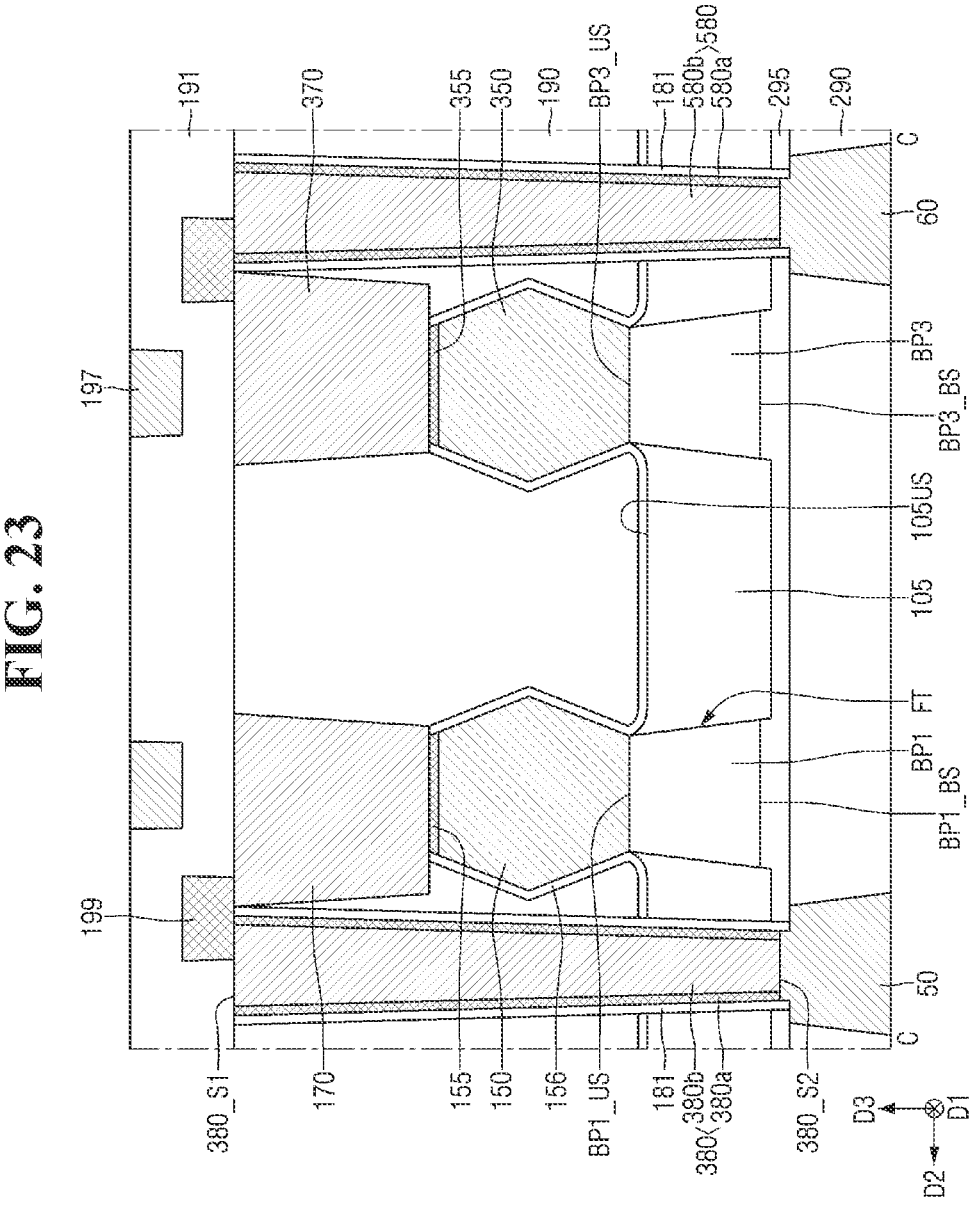

FIGS. 22 and 23 are diagrams for explaining the semiconductor device according to some embodiments, respectively. For convenience of explanation, features that are different from those explained using FIGS. 19 to 21 will be mainly explained.

Referring to FIG. 22, in the semiconductor device according to some embodiments, the first source/drain contact 170 may cover the entire third contact connecting via 380.

The entire third contact connecting via 380 may overlap the first source/drain contact 170 in the third direction D3. From a cross-sectional point of view, the first source/drain contact 170 may cover the entire first surface 380_S1 of the third contact connecting via 380.

In an embodiment, the height H13 from the second surface (50_S2 of FIG. 3) of the first back wiring line 50 to the upper surface of the first source/drain contact 170 is greater than the height H16 from the second surface 50_S2 of the first back wiring line 50 to the first surface 380_S1 of the third contact connecting via 380.

Referring to FIG. 23, in the semiconductor device according to some embodiments, the entire third contact connecting via 380 does not overlap the first source/drain contact 170 in the third direction D3.

A connecting conductive pattern 199 may connect the third contact connecting via 380 and the first source/drain contact 170. The connecting conductive pattern 199 may be disposed on the first surface 380_S1 of the third contact connecting via 380 and the upper surface of the first source/drain contact 170. The connecting conductive pattern 199 includes or is a conductive material.

The third contact connecting via 380 described in FIGS. 22 and 23 may be applied to the fourth to sixth contact connecting vias 480, 580 and 680.

FIGS. 24 to 31 are intermediate step diagrams for describing a method of manufacturing semiconductor device according to some embodiments. The semiconductor device described using FIGS. 1 to 7 may be manufactured, using FIGS. 24 to 31.

Figure 24:
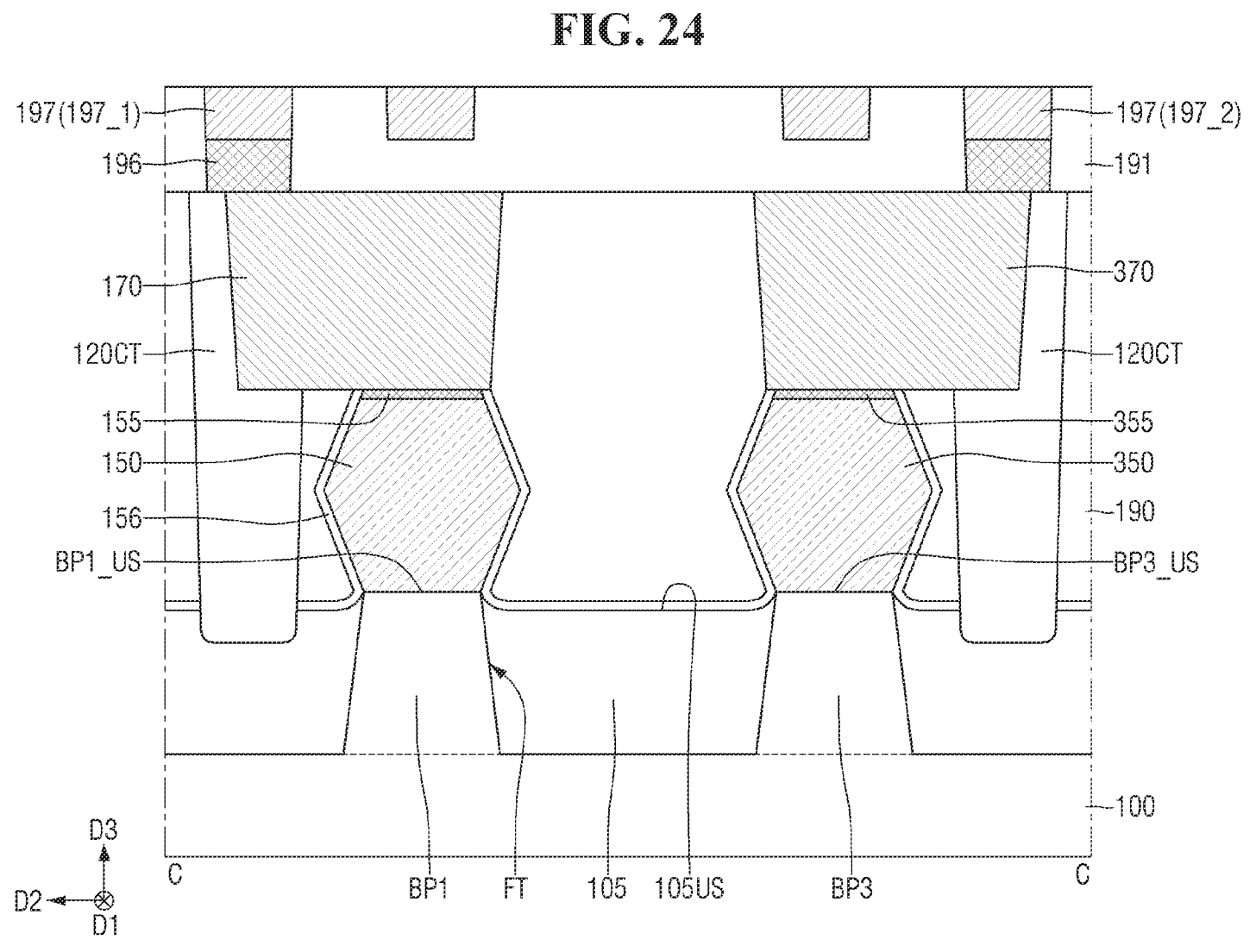
Figure 25:
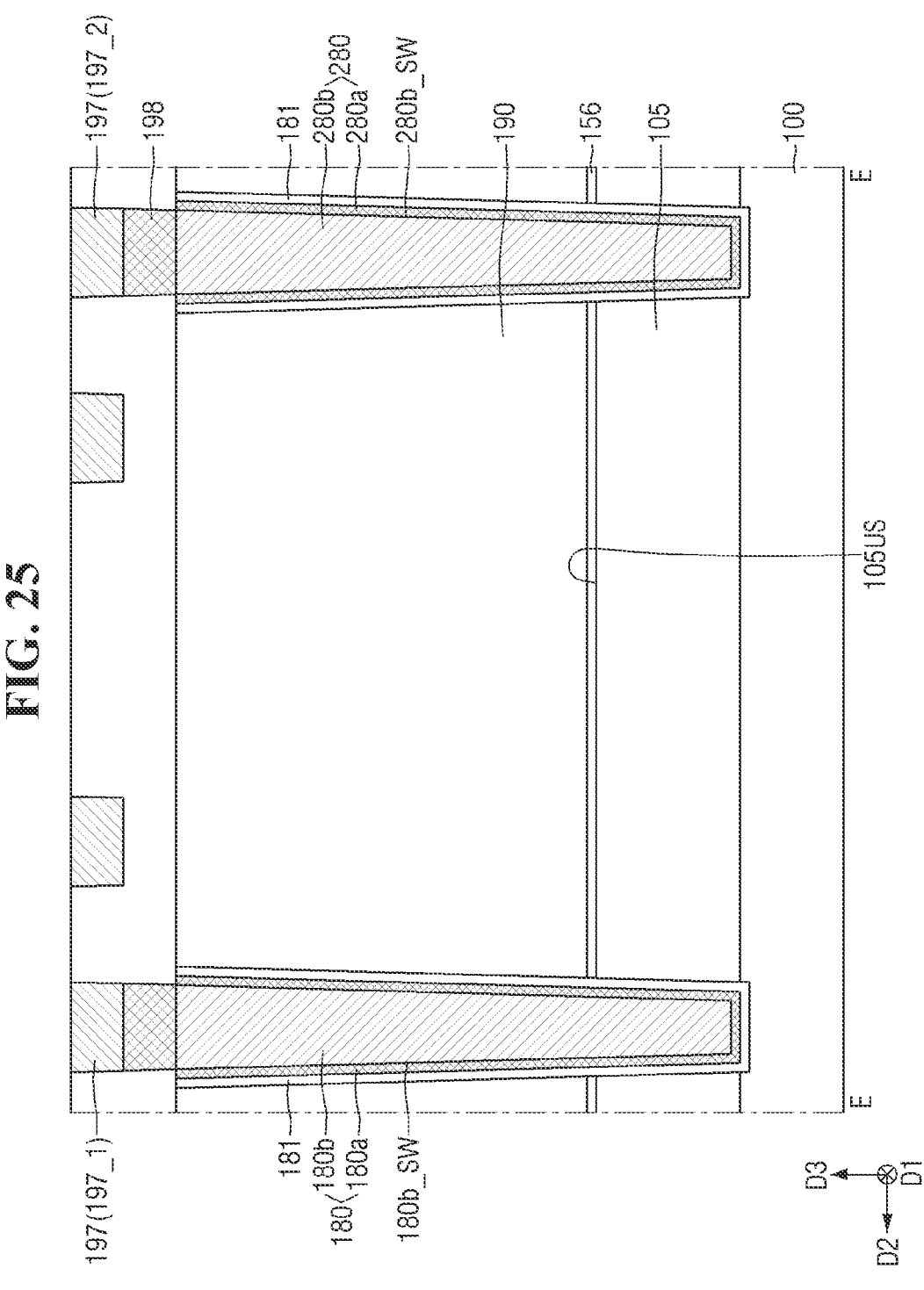

Referring to FIGS. 1, 24 and 25, a first source/drain pattern 150 is formed on the first lower pattern BP1. A third source/drain pattern 350 is formed on the third lower pattern BP3. The first lower pattern BP1 and the third lower pattern BP3 may protrude from the substrate 100.

The source/drain etching stop film 156 is formed along profiles of the first source/drain pattern 150 and the third source/drain pattern 350. The source/drain etching stop film 156 is formed along the upper surface 105US of the field insulating film 105. For example, the source/drain etching stop film 156 may cover the first source/drain pattern 150, the third source/drain pattern 350, and the field insulating film 105. The first upper interlayer insulating film 190 is formed on the source/drain etching stop film 156.

The gate isolation structure 120CT may be formed inside the first upper interlayer insulating film 190. For example, a portion of the first upper interlayer insulating film 190 may be removed and replaced with part of the gate isolation structure 120CT. The first source/drain contact 170 is then formed on the first source/drain pattern 150. The third source/drain contact 370 is formed on the third source/drain pattern 350.

Also, the first contact connecting via 180 and the second contact connecting via 280 extending in the third direction D3 are formed between the first sub-element isolation structure 160_1 and the second sub-element isolation structure 160_2.

Subsequently, the front wiring via 196, the front wiring line 197, and the wiring connecting via 198 are formed.

Figure 26:
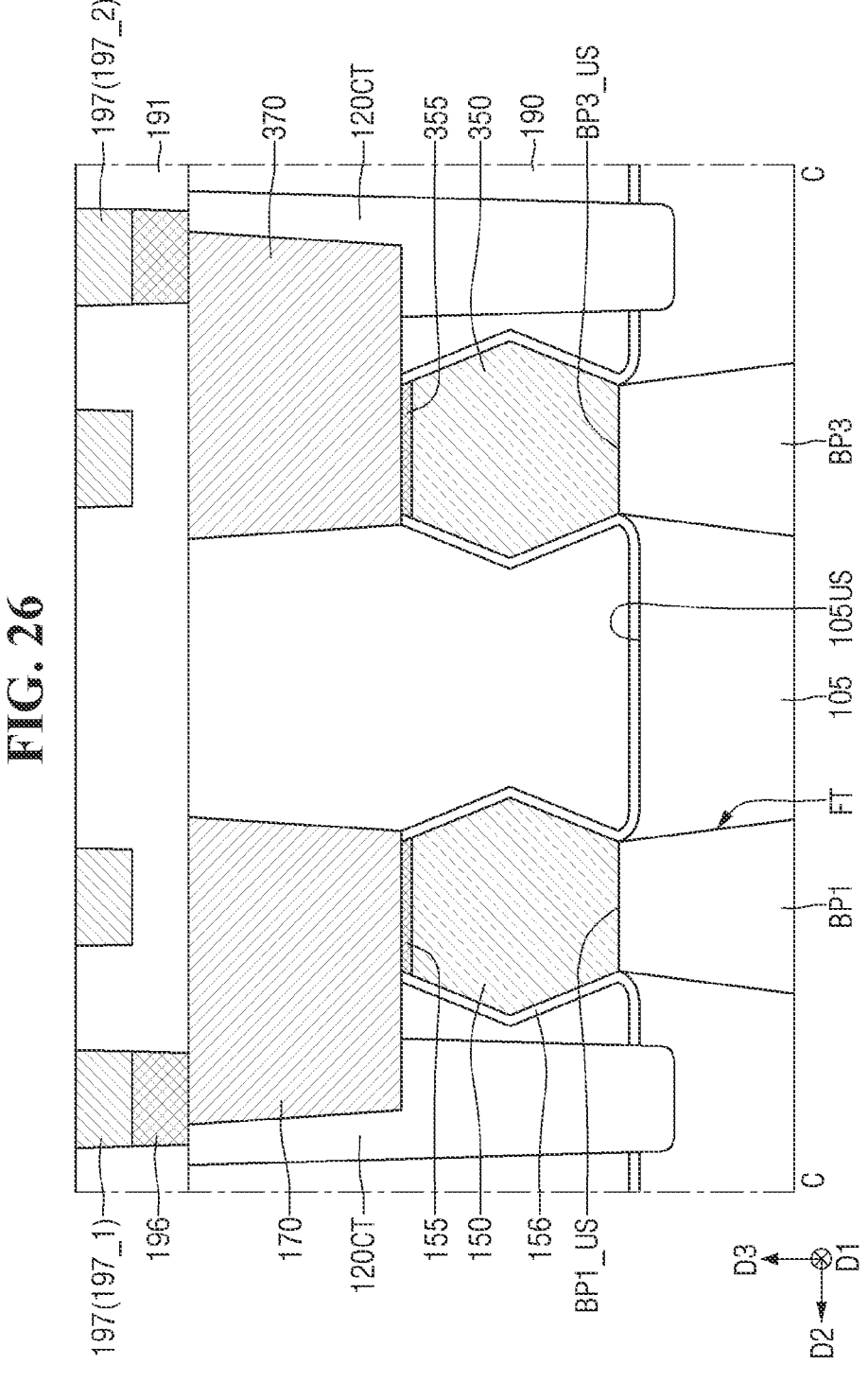
Figure 27:
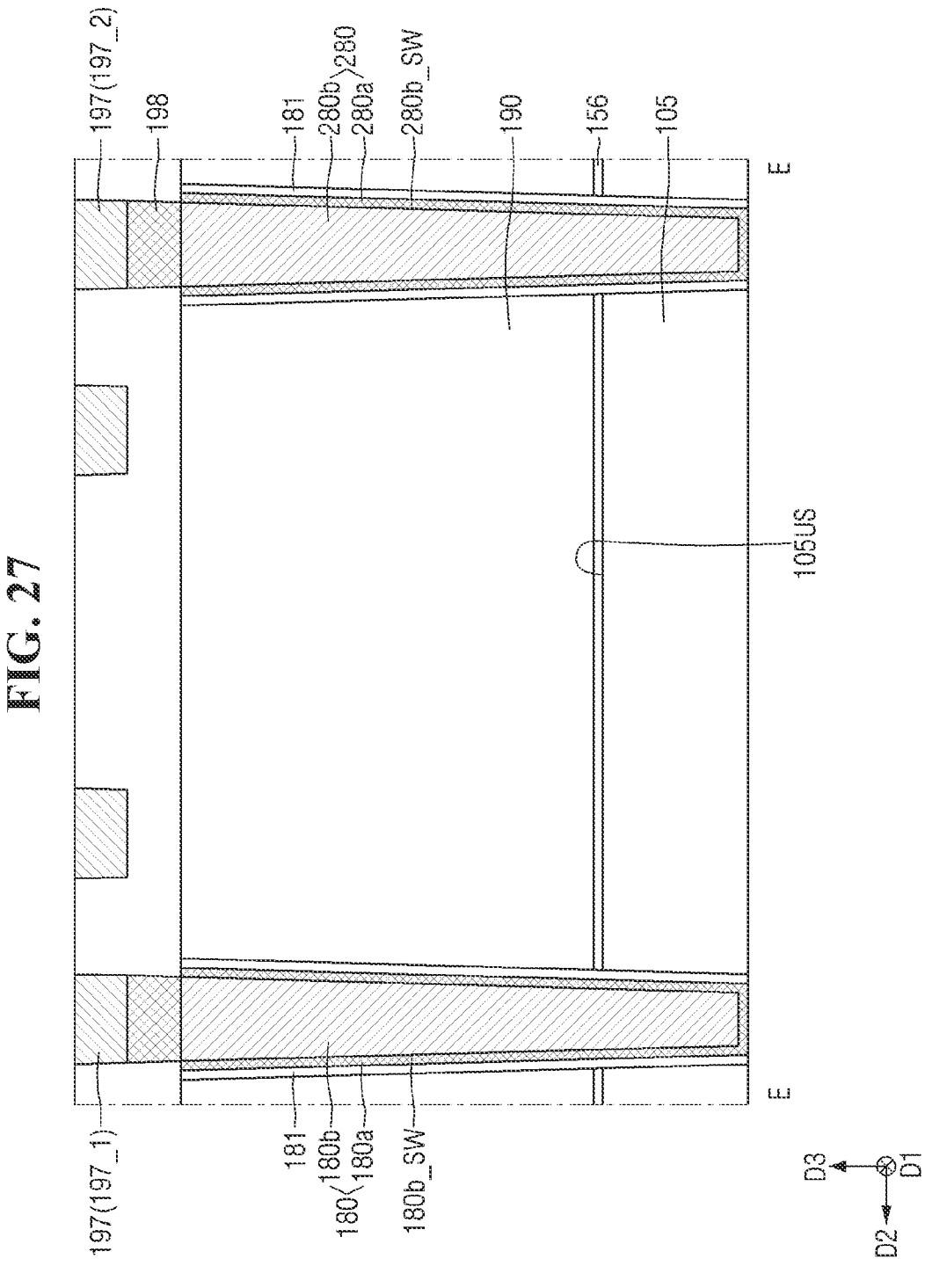

Referring to FIGS. 26 and 27, the substrate 100 is removed to expose the first lower pattern BP1 and the third lower pattern BP3. For example, the removal of the substrate 100 may expose a bottom surface of the first lower pattern BP1 and the third lower pattern BP3.

While the first lower pattern BP1 and the third lower pattern BP3 are being exposed, the first contact connecting via 180 and the second contact connecting via 280 may also be exposed.

Figure 28:
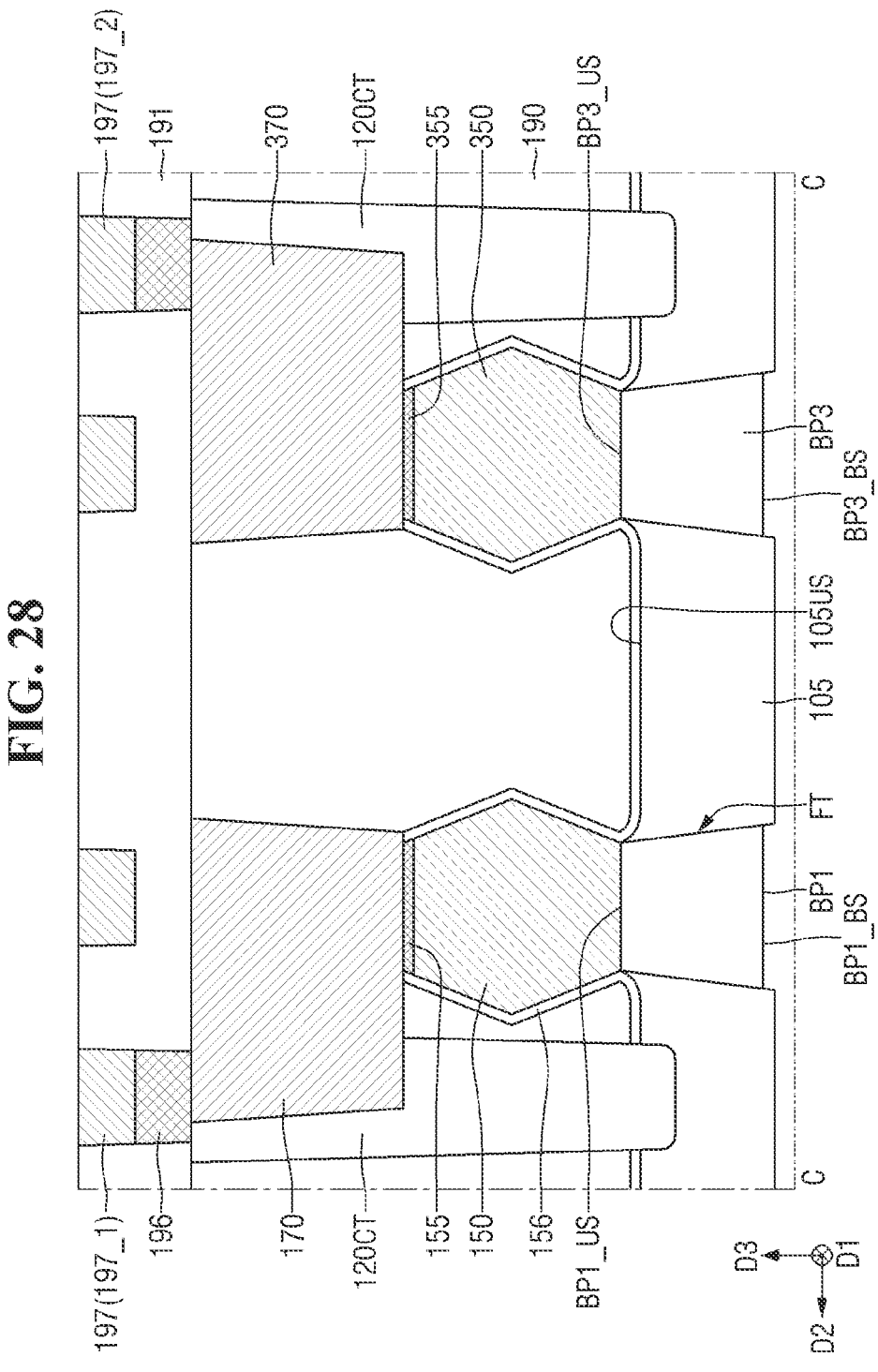
Figure 29:
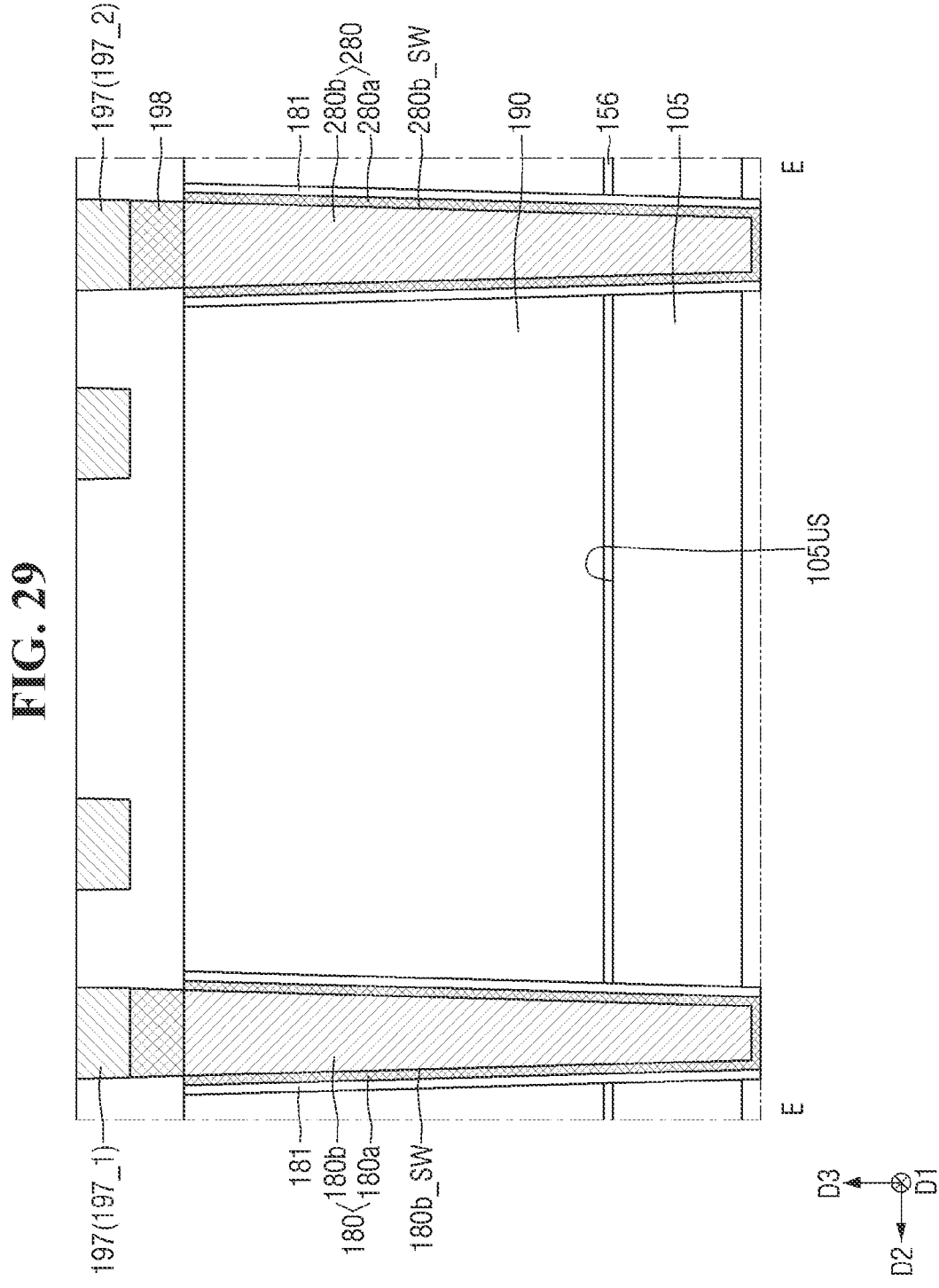

Referring to FIGS. 28 and 29, a part of the field insulating film 105, a part of the first lower pattern BP1 and a part of the third lower pattern BP3 are removed. For example, bottom portions of the field insulating film 105, the first lower pattern BP1 and the third lower pattern BP3 may be removed.

Accordingly, a part of the first contact connecting via 180 and a part of the second contact connecting via 280 may protrude beyond the field insulating film 105. Also, a part of the first contact connecting via 180 and a part of the second contact connecting via 280 may protrude beyond the second surface BP1_BS of the first lower pattern BP1 and the second surface BP3_BS of the third lower pattern BP3.

Figure 30:
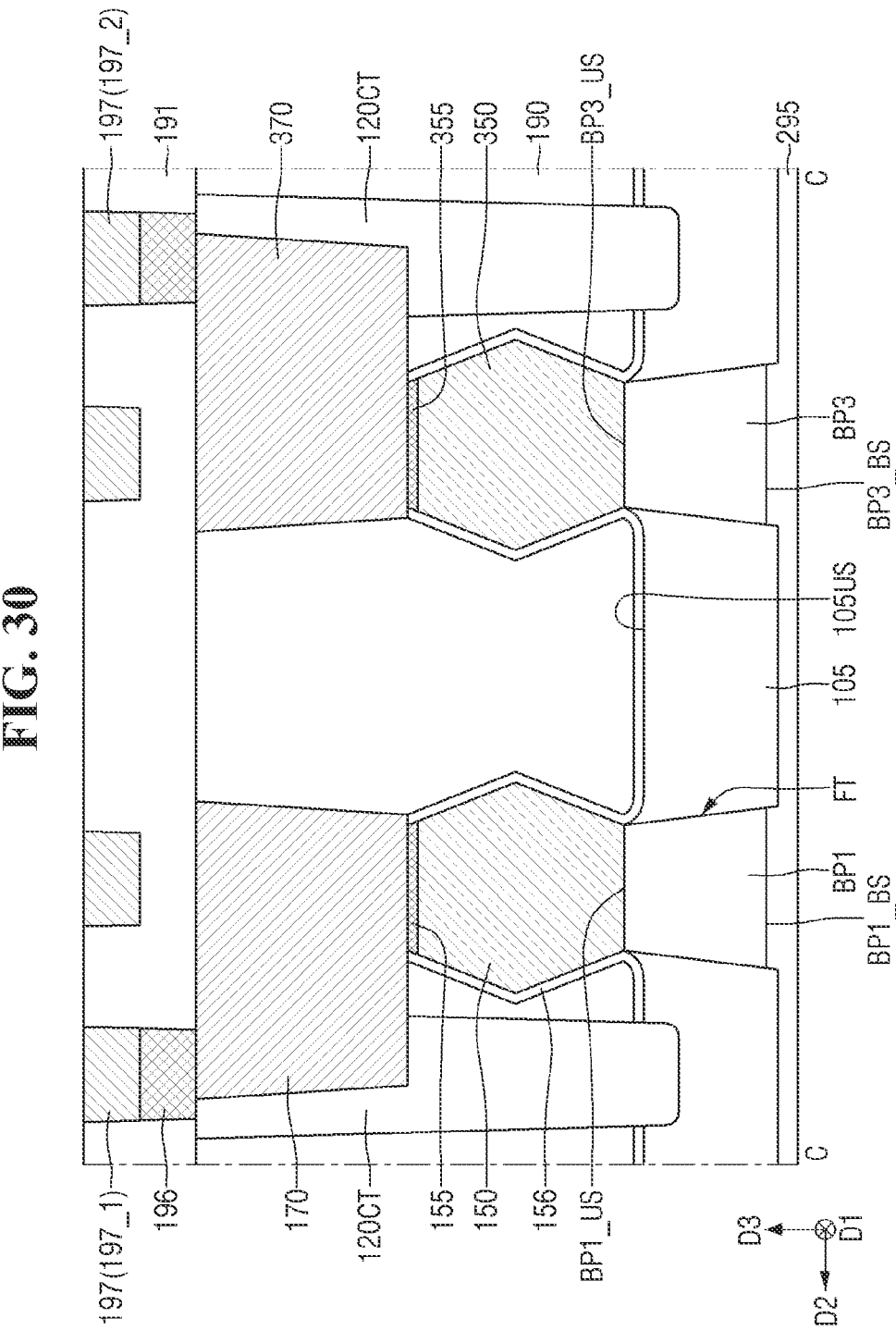
Figure 31:
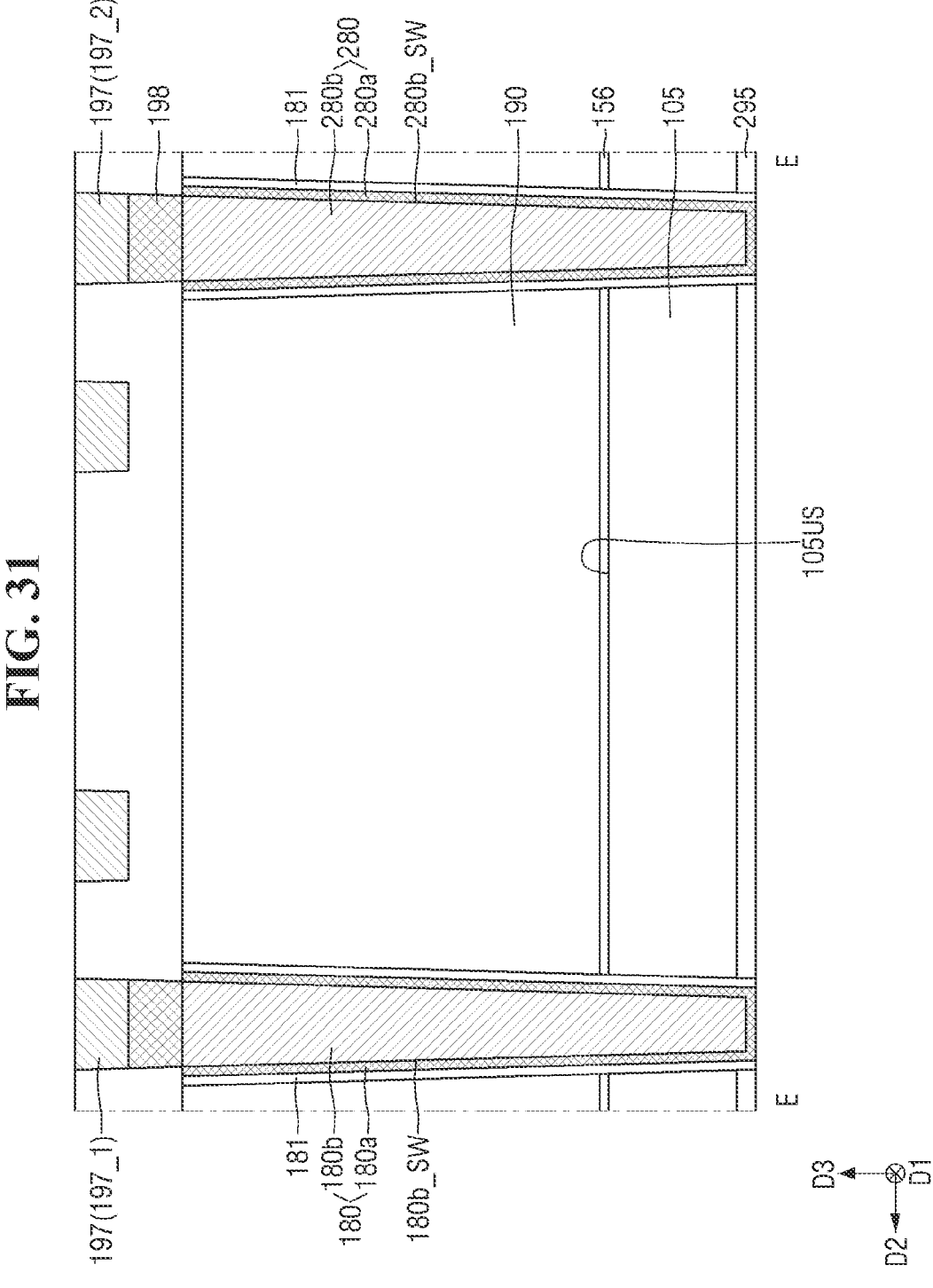

Referring to FIGS. 30 and 31, the insertion insulating film 295 is formed on the second surface BP1_BS of the first lower pattern BP1 and the second surface BP3_BS of the third lower pattern BP3.

The insertion insulating film 295 may also be formed on the field insulating film 105. After the insertion insulating film 295 is formed, the first contact connecting via 180 and the second contact connecting via 280 are exposed.

Referring to FIGS. 2 to 7, the back interlayer insulating film 290 may be formed on the insertion insulating film 295. The first back wiring line 50 and the second back wiring line 60 may be formed inside the back interlayer insulating film 290.

In concluding the detailed description, those skilled in the art will appreciate that many variations and modifications may be made to the embodiments described above without substantially departing from the principles of the present inventive concept. Therefore, the disclosed embodiments of the invention are used in a generic and descriptive sense only and not for purposes of limitation.

What is claimed is:

1. A semiconductor device comprising:
a back interlayer insulating film;
a back wiring line which is disposed in the back interlayer insulating film, includes a first surface and a second surface opposing the first surface in a first direction;
a fin-shaped pattern which is disposed on the first surface of the back wiring line and extends in a second direction;
a field insulating film disposed on a side wall of the fin-shaped pattern;
a source/drain pattern disposed on the fin-shaped pattern;
a source/drain contact which is disposed on the source/drain pattern and connected to the source/drain pattern; and
a contact connecting via which connects the back wiring line and the source/drain contact, and is in contact with the back wiring line, wherein the contact connecting via includes a first surface connected to the source/drain contact, and a second surface connected to the back wiring line, and
a height from the second surface of the back wiring line to an upper surface of the field insulating film is smaller than a height from the second surface of the back wiring line to the first surface of the contact connecting via.

2. The semiconductor device of claim 1,
wherein the contact connecting via comprises a contact connecting plug, and a contact connecting barrier film extending along a side wall of the contact connecting plug, and
the contact connecting plug is in contact with the back wiring line.

3. The semiconductor device of claim 1,
wherein the contact connecting via comprises a contact connecting plug, and a contact connecting barrier film extending along the side wall of the contact connecting plug, and
the contact connecting barrier film is disposed between the contact connecting plug and the back wiring line.

4. The semiconductor device of claim 1, further comprising:
an insertion insulating film disposed between the fin-shaped pattern and the back interlayer insulating film,
the fin-shaped pattern comprises a lower surface that faces the back interlayer insulating film, and
the insertion insulating film is in contact with the lower surface of the fin-shaped pattern.

5. The semiconductor device of claim 1,
wherein a height from the second surface of the back wiring line to a lowermost part of the fin-shaped pattern is greater than a height from the second surface of the back wiring line to the second surface of the contact connecting via.

6. The semiconductor device of claim 1, further comprising:
a first element isolation structure which is disposed on the back wiring line and extends in a third direction; and
a second element isolation structure which is disposed on the back wiring line, extends in the third direction, and is spaced apart from the first element isolation structure in the second direction,
wherein the contact connecting via is disposed between the first element isolation structure and the second element isolation structure.

7. The semiconductor device of claim 6, further comprising:
a front wiring structure disposed on the source/drain contact,
wherein the front wiring structure includes a front wiring line extending in the second direction,
the source/drain contact is disposed between the source/drain pattern and the front wiring line, and
the front wiring line connects the source/drain contact and the contact connecting via.

8. The semiconductor device of claim 1,
wherein the contact connecting via overlaps the source/drain contact in a third direction.

9. The semiconductor device of claim 1,
wherein the back wiring line extends in the second direction, and
a width of the first surface of the back wiring line in the third direction is smaller than a width of the second surface of the back wiring line in the third direction.

10. The semiconductor device of claim 1, wherein the back wiring line extends in the second direction, and a width of the first surface of the back wiring line in the third direction is greater than a width of the second surface of the back wiring line in the third direction.

11. A semiconductor device comprising:

a back interlayer insulating film;

a back wiring line which is disposed inside the back interlayer insulating film, includes a first surface and a second surface opposing the first surface in a first direction;

a first element isolation structure which is disposed on the back wiring line and extends in a second direction;

a second element isolation structure which is disposed on the back wiring line, extends in the second direction, and is spaced apart from the first element isolation structure in a third direction;

a fin-shaped pattern which is disposed on the back wiring line and extends in the third direction;

a gate electrode which is disposed on the fin-shaped pattern and extends in the second direction;

a source/drain pattern which is disposed on the fin-shaped pattern and is connected to the fin-shaped pattern;

a source/drain contact which is disposed on the source/drain pattern and is connected to the source/drain pattern;

a contact connecting via which is disposed between the first element isolation structure and the second element isolation structure, and is in contact with the back wiring line, a width of the contact connecting via increasing as it goes away from the back wiring line; and a front wiring line which is disposed on the first element isolation structure and the second element isolation structure, extends in the third direction, and connects the source/drain contact and the contact connecting via.

12. The semiconductor device of claim 11, wherein the contact connecting via comprises a first surface connected to the front wiring line, and a second surface in contact with the back wiring line, and a height from the second surface of the back wiring line to the upper surface of the source/drain contact is equal to or smaller than a height from the second surface of the back wiring line to the first surface of the contact connecting via.

13. The semiconductor device of claim 11, wherein the contact connecting via comprises a contact connecting plug, and a contact connecting barrier film extending along side walls of the contact connecting plug, and the contact connecting plug is in contact with the back wiring line.

14. The semiconductor device of claim 11, wherein the contact connecting via comprises a contact connecting plug, and a contact connecting barrier film extending along a side wall of the contact connecting plug, and the contact connecting barrier film is disposed between the contact connecting plug and the back wiring line.

15. The semiconductor device of claim 11, further comprising:

an insertion insulating film disposed between the fin-shaped pattern and the back interlayer insulating film, wherein the fin-shaped pattern includes a lower surface that faces the back interlayer insulating film, and the insertion insulating film is in contact with the lower surface of the fin-shaped pattern.

16. The semiconductor device of claim 11, further comprising:

a plurality of sheet patterns disposed on the fin-shaped pattern, wherein the gate electrode surrounds the sheet pattern.

17. A semiconductor device comprising:

a fin-shaped pattern which extends in a first direction, and includes a first surface and a second surface that opposes the first surface in a second direction;

a sheet pattern which is disposed on the first surface of the fin-shaped pattern, and is spaced apart from the fin-shaped pattern in the second direction;

a gate electrode which is disposed on the first surface of the fin-shaped pattern, extends in a third direction, and surrounds the sheet pattern;

a source/drain pattern which is disposed on the first surface of the fin-shaped pattern, and is in contact with the sheet pattern;

a source/drain contact which is disposed on the source/drain pattern and is connected to the source/drain pattern;

an insertion insulating film which is disposed on the second surface of the fin-shaped pattern, and is in contact with the second surface of the fin-shaped pattern;

a back wiring line which is disposed on the second surface of the fin-shaped pattern, extends in the first direction, and includes a first surface and a second surface that opposes the first surface in the second direction; and a contact connecting via which connects the back wiring line and the source/drain contact, and is in contact with the back wiring line, wherein the contact connecting via includes a first surface connected to the source/drain contact, and a second surface connected to the back wiring line, and a height from the second surface of the back wiring line to the first surface of the fin-shaped pattern is smaller than a height from the second surface of the back wiring line to the first surface of the contact connecting via.

18. The semiconductor device of claim 17, further comprising:

a front wiring structure disposed on the source/drain contact, wherein the front wiring structure includes a front wiring line extending in the first direction, the source/drain contact is disposed between the source/drain pattern and the front wiring line, and the front wiring line connects the source/drain contact and the contact connecting via.

19. The semiconductor device of claim 17, wherein the contact connecting via overlaps the source/drain contact in the third direction.

20. The semiconductor device of claim 17, wherein the contact connecting via comprises a contact connecting plug, and a contact connecting barrier film extending along a side wall of the contact connecting plug, and the contact connecting plug is in contact with the back wiring line.

* * * * *